(12) United States Patent
Yoon et al.

(10) Patent No.: US 11,062,741 B2
(45) Date of Patent: Jul. 13, 2021

(54) SEMICONDUCTOR DEVICES

(71) Applicant: SK hynix Inc., Icheon-si (KR)

(72) Inventors: Young Jun Yoon, Icheon-si (KR); Hyun Seung Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/081,677

(22) Filed: Oct. 27, 2020

(65) Prior Publication Data

US 2021/0043236 A1 Feb. 11, 2021

Related U.S. Application Data

(62) Division of application No. 16/179,046, filed on Nov. 2, 2018, now Pat. No. 10,854,248.

(30) Foreign Application Priority Data

May 8, 2018 (KR) .................. 10-2018-0052666

(51) Int. Cl.
*G11C 7/10* (2006.01)
*G11C 7/22* (2006.01)
*G06F 13/16* (2006.01)
*G11C 8/06* (2006.01)
*G11C 8/18* (2006.01)

(52) U.S. Cl.
CPC ............ *G11C 7/10* (2013.01); *G06F 13/1689* (2013.01); *G11C 7/222* (2013.01); *G11C 8/06* (2013.01); *G11C 8/18* (2013.01)

(58) Field of Classification Search
CPC .................................................. G11C 7/1039
USPC .......................................... 711/5; 365/185.11
See application file for complete search history.

(56) References Cited

U.S. PATENT DOCUMENTS 6,202,119 B1 * 3/2001 Manning .............. G11C 7/1039
711/5
2015/0310904 A1 10/2015 Kim et al.

FOREIGN PATENT DOCUMENTS

KR 1020160096934 A 8/2016

* cited by examiner

*Primary Examiner* — Jason Lappas
(74) *Attorney, Agent, or Firm* — William Park & Associates Ltd.

(57) ABSTRACT

A semiconductor device includes an input/output (I/O) line drive control circuit and a data I/O circuit. The I/O line drive control circuit is configured to generate drive control pulses having a generation sequence, wherein the generation sequence of the drive control pulses are controlled based on a command pulse and address latch signals, and wherein the address latch signals are set based on when the command pulse is generated to perform a read operation or a write operation. The command pulse is generated to perform a read operation or a write operation. The data I/O circuit controls data I/O operations of a plurality of bank groups based on the drive control pulses.

4 Claims, 30 Drawing Sheets

914

SEMICONDUCTOR DEVICES

CROSS-REFERENCE TO RELATED APPLICATIONS

The present application is a divisional application of U.S. patent application Ser. No. 16/179,046, filed on Nov. 2, 2018, and claims priority under 35 U.S.C 119(a) to Korean Application No. 10-2018-0052666, filed on May 8, 2018, which is incorporated herein by reference in its entirety.

BACKGROUND

1. Technical Field

Embodiments of the present disclosure relate to semiconductor devices configured for performing a data input/output (I/O) operation.

2. Related Art

In general, each of semiconductor devices such as dynamic random access memory (DRAM) devices may include a plurality of bank groups comprised of cell arrays which are selected by addresses. Each of the bank groups may be realized to include a plurality of banks. The semiconductor device may select any one of the plurality of bank groups and may perform a read operation for outputting data stored in a cell array included in the selected bank group through I/O lines or a write operation for storing data inputted through the I/O lines into the cell array included in the selected bank group.

SUMMARY

According to an embodiment, a semiconductor device includes an input/output (I/O) line drive control circuit and a data I/O circuit. The I/O line drive control circuit may be configured to generate drive control pulses having a generation sequence, wherein the generation sequence of the drive control pulses are controlled based on a command pulse and address latch signals, and wherein the address latch signals are set based on when the command pulse is generated to perform a read operation or a write operation. The command pulse may be generated to perform a read operation or a write operation. The data I/O circuit controls data I/O operations of a plurality of bank groups based on the drive control pulses.

According to an embodiment, a semiconductor device includes an input/output (I/O) line drive control circuit that generates first to fourth drive control pulses for controlling data I/O operations of first to fourth bank groups according to a logic level combination of first and second address latch signals. The I/O line drive control circuit generates the third drive control pulse after the first drive control pulse is generated when both of the first and second address latch signals have a first logic level.

According to an embodiment, a semiconductor device includes a command/address control circuit and a first core circuit. The command/address control circuit generates first and second input/output (I/O) control pulses and first and second address latch signals on the basis of information included in an external control signal. The first core circuit controls data I/O operations of first to fourth bank groups based on the first I/O control pulse and the first and second address latch signals.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Figure 1:
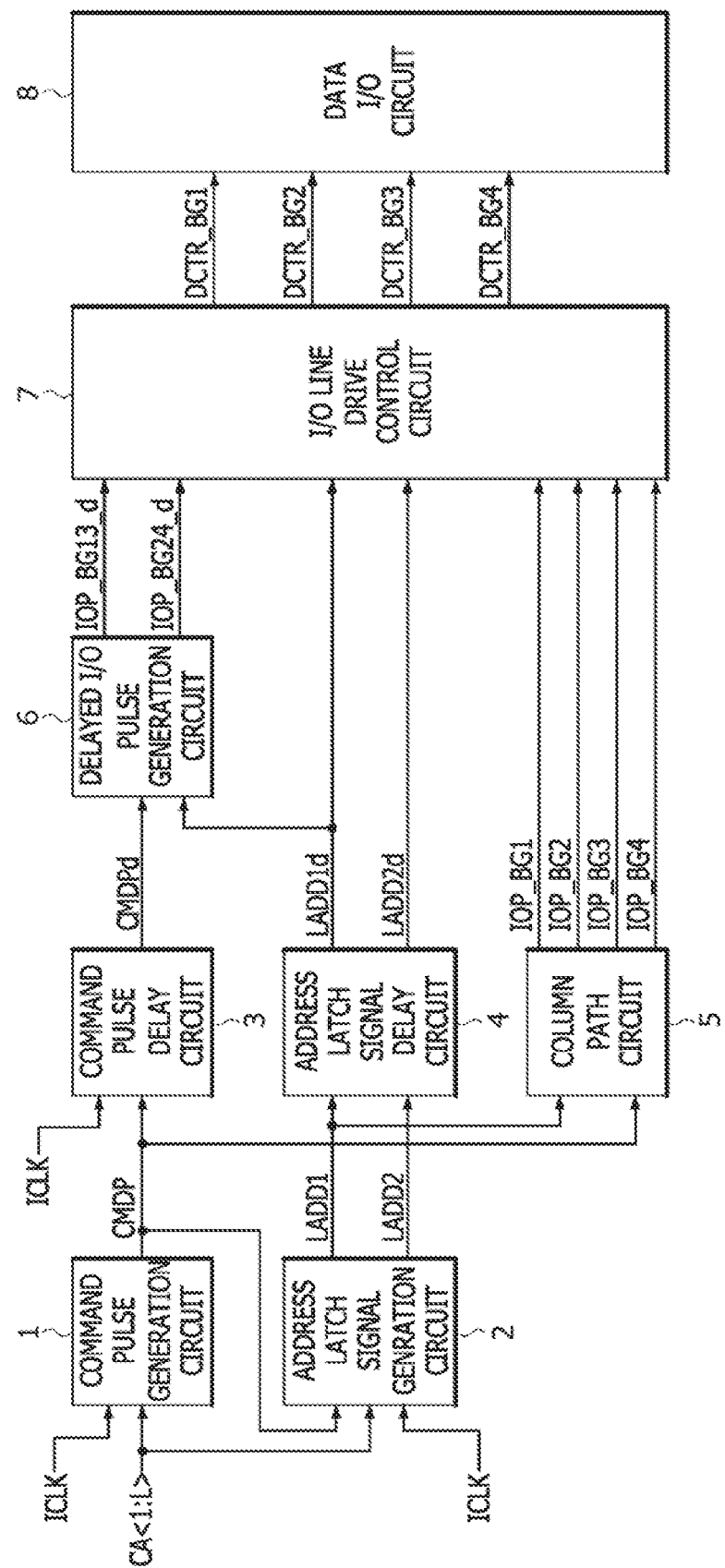
FIG. 1 is a block diagram illustrating a configuration of a semiconductor device according to an embodiment of the present disclosure.

As illustrated in FIG. 1, a semiconductor device according to an embodiment may include a command pulse generation circuit 1, an address latch signal generation circuit 2, a command pulse delay circuit 3, an address latch signal delay circuit 4, a column path circuit 5, a delayed I/O pulse generation circuit 6, an I/O line drive control circuit 7 and a data I/O circuit 8.

The command pulse generation circuit 1 may generate a command pulse CMDP based on an external control signal CA<1:L> and an internal clock signal ICLK, The external control signal CA<1:L> may include a command and an address that are provided by an external device. The internal clock signal ICLK may be toggled in synchronization with a predetermined edge of a clock signal (not shown) that is provided by the external device or another external device. For example, the internal clock signal ICLK may be toggled in synchronization with a rising edge of the clock signal (not shown). The number 'L' of bits included in the external control signal CA<1:L> may be set to be different according to the embodiments. The external control signal CA<1:L> may be replaced with a signal which is generated by a circuit in the semiconductor device in some embodiments, and the internal clock signal ICLK may be replaced with a clock signal provided by the external device in some embodiments.

The command pulse generation circuit 1 may generate the command pulse CMDP at a point of time that the external control signal CA<1:L> having a predetermined logic level combination is inputted to the command pulse generation circuit 1 in synchronization with the internal clock signal ICLK. The command pulse CMDP may be generated to perform a read operation or a write operation according to the embodiments. The command pulse generation circuit 1 may decode the external control signal CA<1 L> to generate the command pulse CMDP.

The address latch signal generation circuit 2 may generate a first address latch signal LADD1 and a second address latch signal LADD2 based on the external control signal CA<1:L>, the internal clock signal ICLK and the command pulse CMDP. The address latch signal generation circuit 2 may latch an address, which is extracted from the external control signal CA<1:L> in synchronization with the internal clock signal ICLK, to generate the first and second address latch signals LADD1 and LADD2 at a point of time that the command pulse CMDP is generated. A configuration and an operation of the address latch signal generation circuit 2 will be described with reference to FIG. 2 later.

The command pulse delay circuit 3 may generate a delayed command pulse CMDPd from the command pulse CMDP based on the internal clock signal ICLK. The command pulse delay circuit 3 may delay the command pulse CMDP by a delay period set by the internal clock signal ICLK to generate the delayed command pulse CMDPd. A configuration and an operation of the command pulse delay circuit 3 will be described with reference to FIG. 3 later.

The address latch signal delay circuit 4 may delay the first address latch signal LADD1 to generate a first delayed address latch signal LADD1d. The address latch signal delay circuit 4 may delay the second address latch signal LADD2 to generate a second delayed address latch signal LADD2d. In the present embodiment, a delay period of the first address latch signal LADD1 may be set to be equal to a delay period of the second address latch signal LADD2. In some other embodiments, the delay period of the first address latch signal LADD1 may be set to be different from the delay period of the second address latch signal LADD2. A configuration and an operation of the address latch signal delay circuit 4 will be described more fully with reference to FIG. 4 later.

The column path circuit 5 may generate a first bank I/O pulse IOP_BG1, a second bank I/O pulse IOP_BG2, a third bank I/O puke IOP_BG3 and a fourth bank I/O pulse IOP_BG4 based on the first address latch signal LADD1 and the command pulse CMDP. The column path circuit 5 may buffer the command pulse CMDP to generate the first to fourth bank I/O pulses IOP_BG1, IOP_BG2, IOP_BG3 and IOP_BG4 according to a logic level of the first address latch signal LADD1. For example, the column path circuit 5 may buffer the command pulse CMDP to generate the first and third bank I/O pulses IOP_BG1 and IOP_BG3 if the first address latch signal LADD1 has a first logic level, and the column path circuit 5 may buffer the command pulse CMDP to generate the second and fourth bank I/O pulses IOP_BG2 and IOP_BG4 if the first address latch signal LADD1 has a second logic level. In the present embodiment, the first logic level of the first address latch signal LADD1 may be set as a logic "low" level and the second logic level of the first address latch signal LADD1 may be set as a logic "high" level. Pulses generated according to a logic level of the first address latch signal LADD1 among the first to fourth bank I/O pulses IOP_BG1, IOP_BG2, IOP_BG3 and IOP_BG4 may be set to be different according to the embodiments. A configuration and an operation of the column path circuit 5 will be described with reference to FIG. 5 later.

The delayed I/O (input and output) pulse generation circuit 6 may generate a first delayed I/O pulse IOP_BG13_$d$ and a second delayed I/O pulse IOP_BG24_$d$ based on the first delayed address latch signal LADD1$d$ and the delayed command pulse CMDPd. The delayed I/O pulse generation circuit 6 may buffer the delayed command pulse CMDPd to generate the first delayed I/O pulse IOP_BG13_$d$ or the second delayed I/O pulse IOP_BG24_$d$ according to a logic level of the first delayed address latch signal LADD1$d$. For example, the delayed I/O pulse generation circuit 6 may buffer the delayed command pulse CMDPd to generate the first delayed I/O pulse IOP_BG13_$d$ if the first delayed address latch signal LADD1$d$ has a first logic level, and the delayed I/O pulse generation circuit 6 may buffer the delayed command pulse CMDPd to generate the second delayed I/O pulse IOP_BG24_$d$ if the first delayed address latch signal LADD1$d$ has a second logic level. In the present embodiment, the first logic level of the first delayed address latch signal LADD1*d* may be set as a logic "low" level and the second logic level of the first delayed address latch signal LADD1*d* may be set as a logic "high" level. A pulse generated according to a logic level of the first delayed address latch signal LADD1*d* among the first and second delayed I/O pulses IOP_BG13_*d* and I/O pulse IOP_BG24_*d* may be set to be different according to the embodiments. A configuration and an operation of the delayed I/O pulse generation circuit 6 will be described with reference to FIG. 6 later.

The I/O line drive control circuit 7 may generate a first drive control pulse DCTR_BG1, a second drive control pulse DCTR_BG2, a third drive control pulse DCTR_BG3 and a fourth drive control pulse DCTR_BG4 based on the first delayed address latch signal LADD1*d*, the second delayed address latch signal LADD2*d*, the first delayed I/O pulse IOP_BG13_*d*, the second delayed I/O pulse IOP_BG24_*d*, the first bank I/O pulse IOP_BG1, the second bank I/O pulse IOP_BG2, the third bank I/O pulse IOP_BG3 and the fourth bank I/O pulse IOP_BG4. The I/O line drive control circuit 7 may selectively sample the first delayed I/O pulse IOP_BG13_*d*, the second delayed I/O pulse IOP_BG24_*d*, the first bank I/O pulse IOP_BG1, the second bank I/O pulse IOP_BG2, the third bank I/O pulse IOP_BG3 and the fourth bank I/O pulse IOP_BG4 to generate the first to fourth drive control pulses DCTR_BG1, DCTR_BG2, DCTR_BG3 and DCTR_BG4. The generation sequence of the first to fourth drive control pulses DCTR_BG1, DCTR_BG2, DCTR_BG3 and DCTR_BG4 are controlled, according to logic levels of the first delayed address latch signal LADD1*d* and the second delayed address latch signal LADD2*d*. A configuration and an operation of the I/O line drive control circuit 7 will be described with reference to FIGS. 7 to 12 later.

The data I/O circuit 8 may perform a data I/O operation based on the first drive control pulse DCTR_BG1, the second drive control pulse DCTR_BG2, the third drive control pulse DCTR_BG3 and the fourth drive control pulse DCTR_BG4. The data I/O circuit 8 may control a sequence of data I/O operations of bank groups (81~84 of FIG. 13) according to the generation sequence of the first to fourth drive control pukes DCTR_BG1, DCTR_BG2, DCTR_BG3 and DCTR_BG4. A configuration and an operation of the data I/O circuit 8 will be described with reference to FIG. 13 later.

Figure 2:
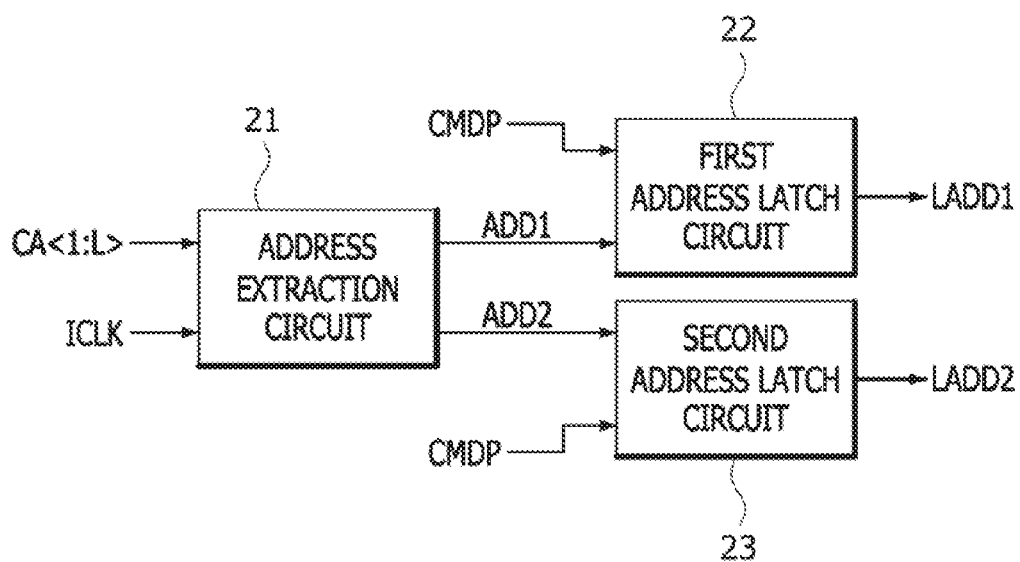
FIG. 2 is a block diagram illustrating an example of an address latch signal generation circuit included in the semiconductor device of FIG. 1.

Referring to FIG. 2, the address latch signal generation circuit 2 may include an address extraction circuit 21, a first address latch circuit 22 and a second address latch circuit 23. The address extraction circuit 21 may generate a first address ADD1 and a second address ADD2 from the external control signal CA<1:L> based on the internal clock signal ICLK. The address extraction circuit 21 may output the data of predetermined bits of the external control signal CA<1:L> inputted to the address extraction circuit 21 in synchronization with the internal clock signal ICLK as the first address ADD1. The predetermined bits of the external control signal CA<1:L> to be outputted as the first address ADD1 may be set to be different according to the embodiments. The address extraction circuit 21 may output the data of predetermined bits of the external control signal CA<1:L> inputted to the address extraction circuit 21 in synchronization with the internal clock signal ICLK as the second address ADD2. The predetermined bits of the external control signal CA<1:L> to be outputted as the second address ADD2 may be set to be different according to the embodiments. The first address latch circuit 22 may latch the first address ADD1 to output the latched first address as the first address latch signal LADD1, in synchronization with a point of time that the command pulse CMDP is created. The second address latch circuit 22 may latch the second address ADD2 to output the latched second address as the second address latch signal LADD2, in synchronization with a point of time that the command pulse CMDP is created.

Figure 3:
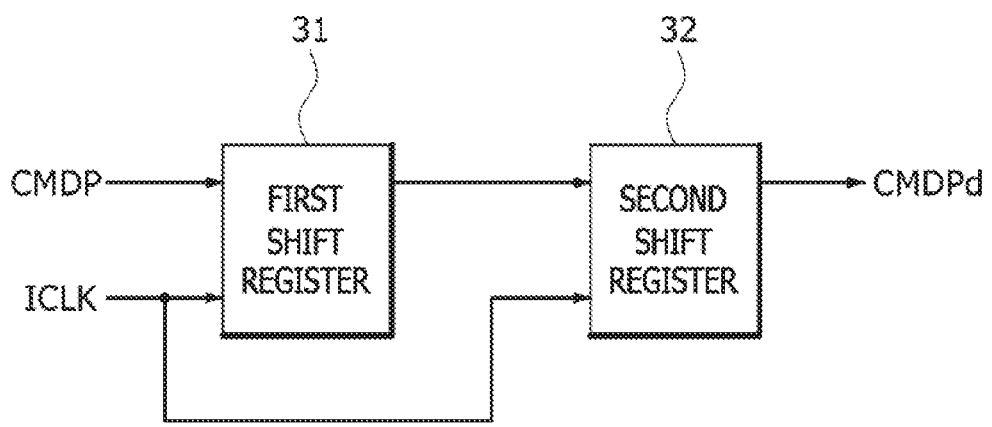
FIG. 3 is a block diagram illustrating an example of a command pulse delay circuit included in the semiconductor device of FIG. 1.

Referring to FIG. 3, the command pulse delay circuit 3 may include a first shift register 31 and a second shift register 32. The first shift register 31 may shift the command pulse CMDP by one cycle of the internal clock signal ICLK. The second shift register 32 may shift an output signal of the first shift register 31 by one cycle of the internal clock signal ICLK. The command pulse delay circuit 3 may delay the command pulse CMDP by a period corresponding to two cycles of the internal clock signal ICLK to generate the delayed command pulse CMDPd.

Figure 4:
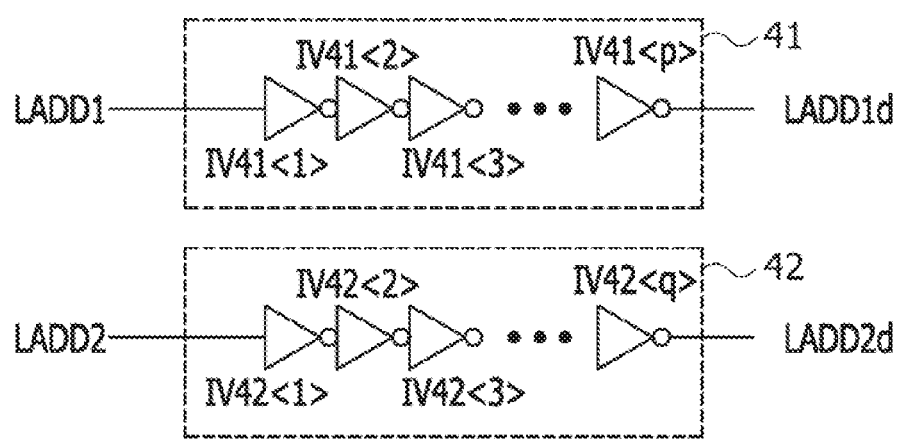
FIG. 4 is a circuit diagram illustrating an example of an address latch signal delay circuit included in the semiconductor device of FIG. 1.

Referring to FIG. 4, the address latch signal delay circuit 4 may include a first address delay circuit 41 and a second address delay circuit 42. The first address delay circuit 41 may be realized using an inverter chain comprised of first to $P^{th}$ inverters IV41<1:P> that are cascaded. The first address delay circuit 41 may delay the first address latch signal LADD1 using, for example, the inverter chain comprised of the first to $P^{th}$ inverters IV41<1:P> to output the delayed signal of the first address latch signal LADD1 as the first delayed address latch signal LADD1*d*. The second address delay circuit 42 may be realized using an inverter chain comprised of first to $Q^{th}$ inverters IV42<1:Q> that are cascaded. The second address delay circuit 42 may delay the second address latch signal LADD2 using, for example, the inverter chain comprised of the first to $Q^{th}$ inverters IV42<1:Q> to output the delayed signal of the second address latch signal LADD2 as the second delayed address latch signal LADD2*d*. In the present embodiment, the number 'ID' of inverters included in the first to $P^{th}$, inverters IV41<1:P> may be set to be equal to the number 'Q' of inverters included in the first to $Q^{th}$ inverters IV42<1:Q>. In an embodiment, the number 'ID' of inverters included in the first to $P^{th}$ inverters IV41<1:P> may be set to be different from the number 'Q' of inverters included in the first to $Q^{th}$ inverters IV42<1:Q>.

Figure 5:
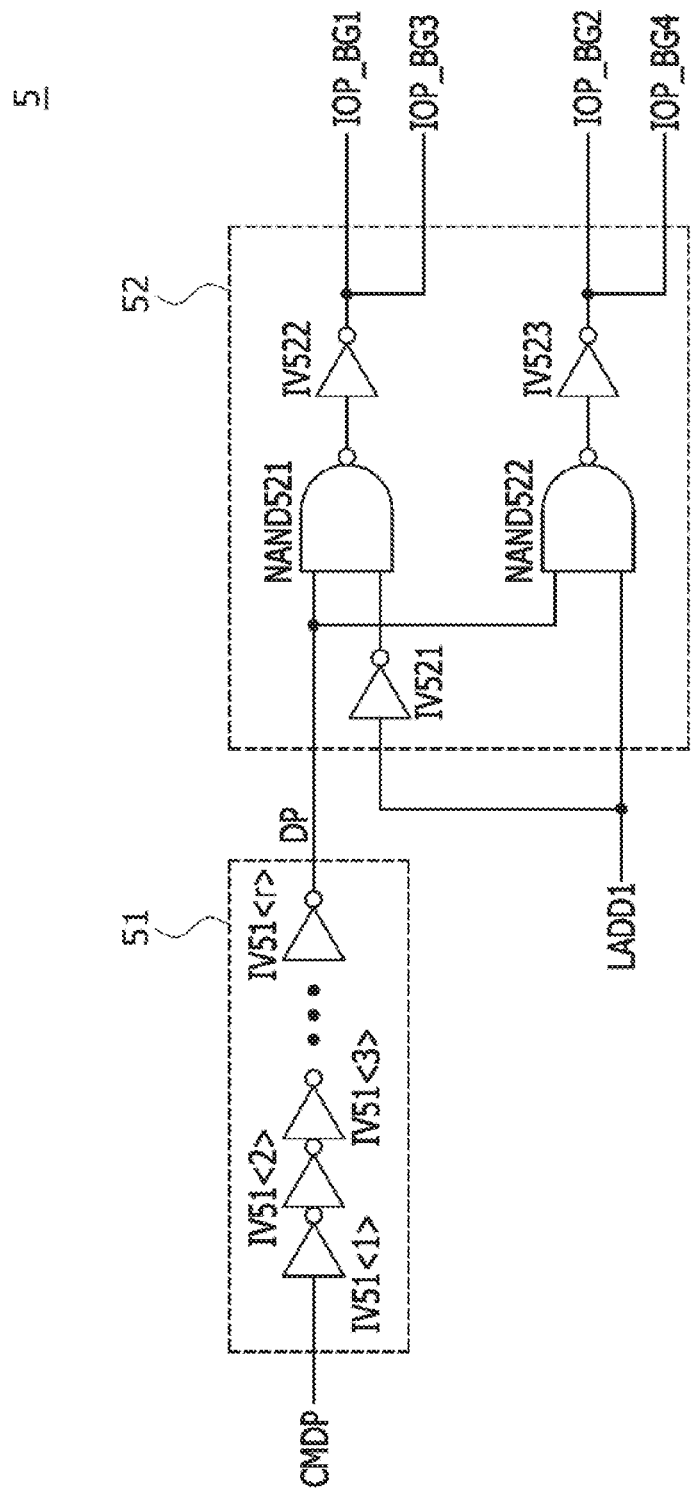
FIG. 5 is a circuit diagram illustrating an example of a column path circuit included in the semiconductor device of FIG. 1.

Referring to FIG. 5, the column path circuit 5 may include a command delay circuit 51 and a bank I/O pulse generator 52. The command delay circuit 51 may be realized using an inverter chain comprised of first to $R^{th}$ inverters IV51<1:R> that are cascaded. The command delay circuit 51 may delay the command pulse CMDP using the inverter chain comprised of the first to $R^{th}$ inverters IV51<1:R> to output the delayed command pulse as a delayed pulse DP. The number 'R' of inverters included in the first to $R^{th}$ inverters IV51<1:R> may be set to be different according to the embodiments. The bank I/O pulse generator 52 may be configured to perform, for example, inversion and NAND operations. The bank I/O pulse generator 52 may include, for example, inverters IV521~IV523 and NAND gates NAND521 and NAND522. The inverter IV521 may inversely buffer the first address latch signal LADD1 and may output the inversely buffered signal of the first address latch signal LADD1. The NAND gate NAND521 and the inverter IV522 may perform a logical AND operation of the delayed pulse DP and an output signal of the inverter IV521 to output the result of the logical AND operation as the first bank I/O pulse IOP_BG1 and the third bank I/O pulse IOP_BG3. The NAND gate NAND522 and the inverter IV523 may perform a logical AND operation of the delayed pulse DP and the first address latch signal LADD1 to output the result of the logical AND operation as the second bank I/O pulse IOP_BG2 and the fourth bank I/O pulse IOP_BG4. The bank I/O pulse generator 52 may buffer the delayed pulse DP to output the buffered signal of the delayed pulse DP as the first bank I/O pulse IOP_BG1 and the third bank I/O pulse IOP_BG3 if the first address latch signal LADD1 has a logic "low" level. The bank I/O pulse generator 52 may buffer the delayed pulse DP to output the buffered signal of the delayed pulse DP as the second bank I/O pulse IOP_BG2 and the fourth bank I/O pulse IOP_BG4 if the first address latch signal LADD1 has a logic "high" level.

Figure 6:
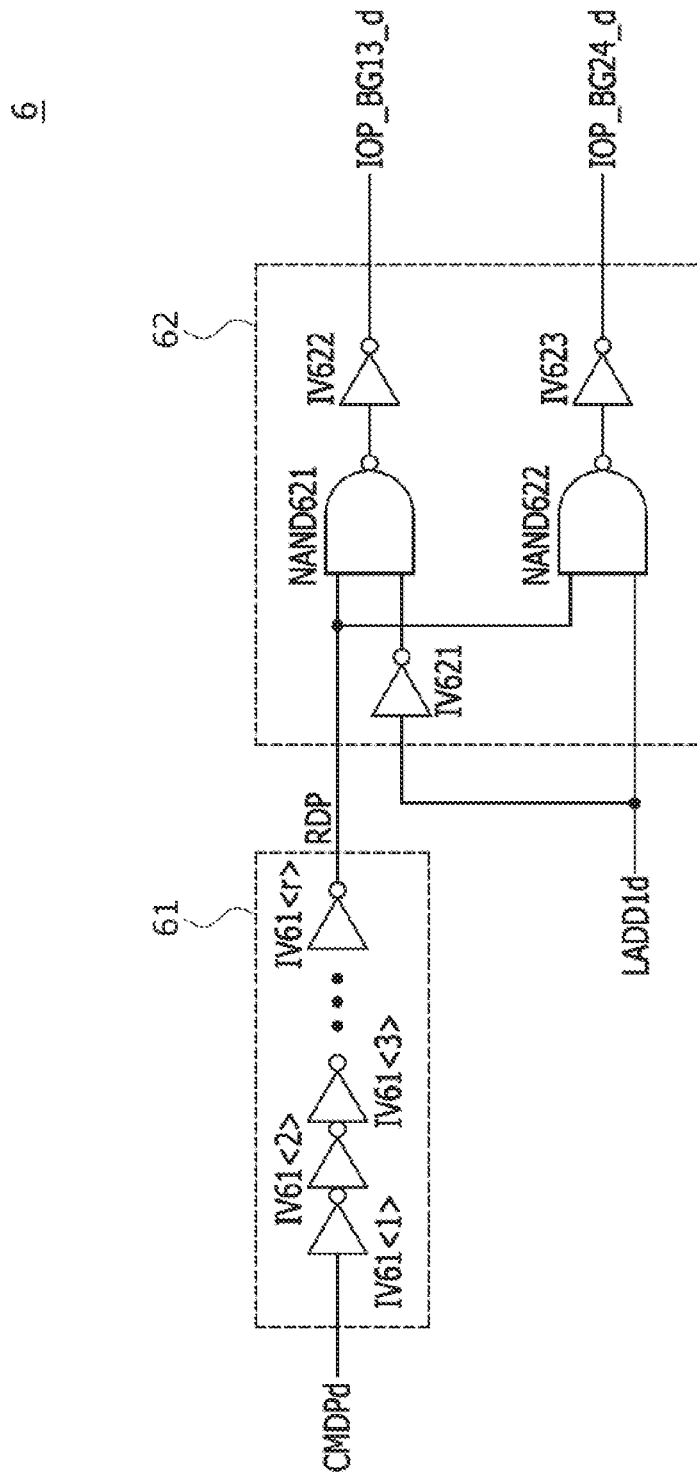
FIG. 6 is a circuit diagram illustrating an example of a delayed I/O pulse generation circuit included in the semiconductor device of FIG. 1.

Referring to FIG. 6, the delayed I/O pulse generation circuit 6 may include a replica command delay circuit 61 and a delay I/O pulse generator 62. The replica command delay circuit 61 may be realized using, for example, an inverter chain comprised of first to $R^{th}$ inverters $IV61<1:R>$ that are cascaded. The replica command delay circuit 61 may delay the delayed command pulse CMDPd using the inverter chain comprised of the first to $R^{th}$ inverters IV61<1:R> to output the delayed pulse of the delayed command pulse CMDPd as a replica delay pulse RDP. The number 'R' of inverters included in the first to $R^{th}$ inverters IV61<1:R> may be set to be different according to the embodiments. The delay I/O pulse generator 62 may be configured to perform, for example, inversion and NAND operations. For example, the delay I/O pulse generator 62 may include inverters IV621~IV623 and NAND gates NAND621 and NAND622. The inverter IV621 may inversely buffer the first delayed address latch signal LADD1d and may output the inversely buffered signal of the first delayed address latch signal LADD1d. The NAND gate NAND621 and the inverter W622 may perform a logical AND operation of the replica delay pulse RDP and an output signal of the inverter IV621 to output the result of the logical AND operation as the first delayed I/O pulse IOP_BG13_d. The NAND gate NAND622 and the inverter W623 may perform a logical AND operation of the replica delay pulse RDP and the first delayed address latch signal LADD1d to output the result of the logical AND operation as the second delayed I/O pulse IOP_BG24_d. The delay I/O pulse generator 62 may buffer the replica delay pulse RDP to output the buffered signal of the replica delay pulse DP as the first delayed I/O pulse IOP_BG13_d if the first delayed address latch signal LADD1d has a logic "low" level. The delay I/O pulse generator 62 may buffer the replica delay pulse RDP to output the buffered signal of the replica delay pulse RDP as the second delayed I/O pulse IOP_BG24_d if the first delayed address latch signal LADD1d has a logic "high" level.

Figure 7:
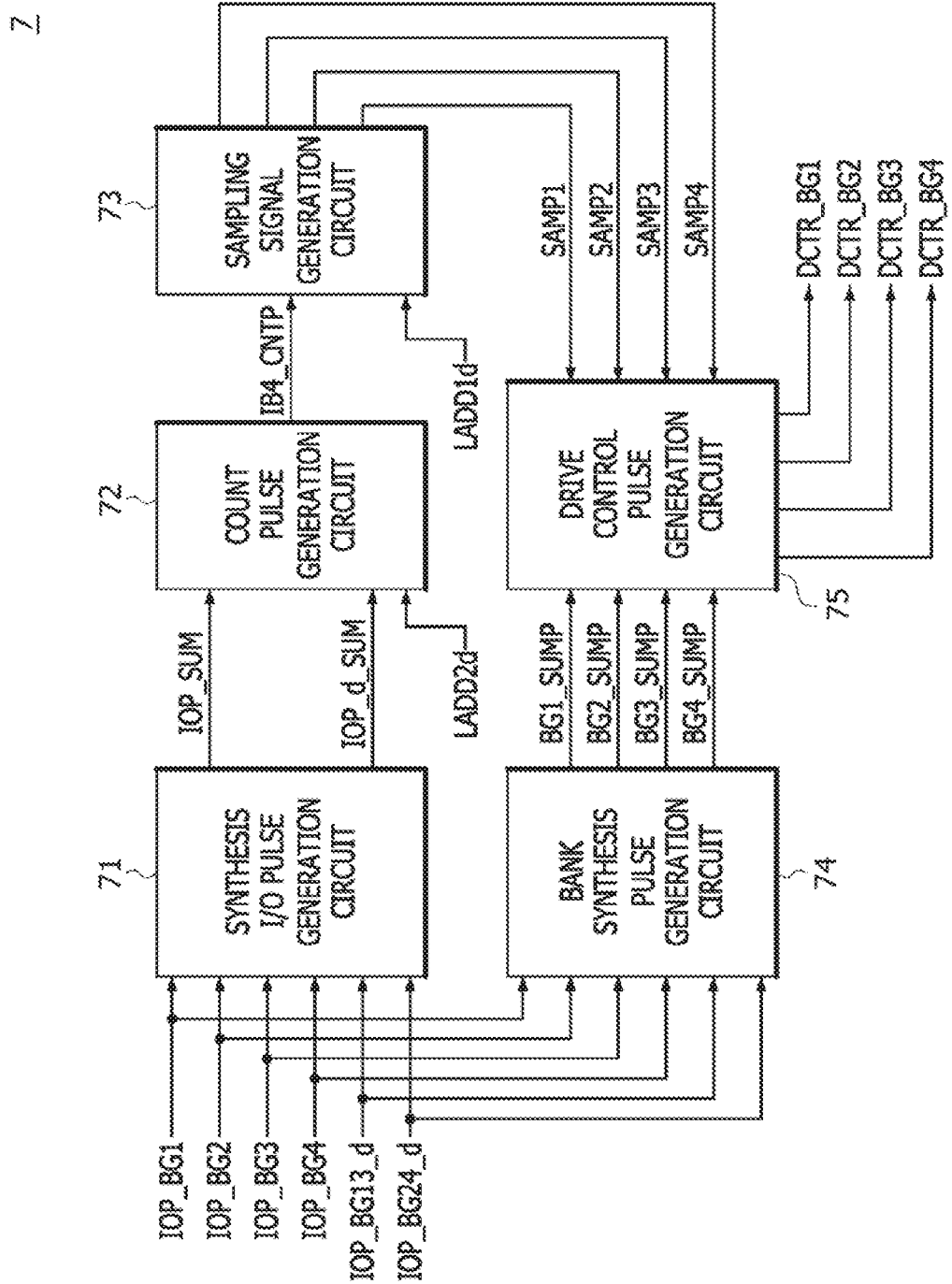
FIG. 7 is a block diagram illustrating an example of an I/O line drive control circuit included in the semiconductor device of FIG.

Referring to FIG. 7, the I/O line drive control circuit 7 may include a synthesis I/O pulse generation circuit 71, a count pulse generation circuit 72, a sampling signal generation circuit 73, and a bank synthesis pulse generation circuit 74 and a drive control pulse generation circuit 75.

The synthesis I/O pulse generation circuit 71 may synthesize the first bank I/O pulse IOP_BG1, the second bank I/O pulse IOP_BG2, the third bank I/O pulse IOP_BG3 and the fourth bank I/O pulse IOP_BG4 to generate a synthesized I/O pulse IOP_SUM. The synthesis I/O pulse generation circuit 71 may generate the synthesized I/O pulse IOP_SUM if any one of the first to fourth bank I/O pulses IOP_BG1~IOP_BG4 is created. The synthesis I/O pulse generation circuit 71 may synthesize the first delayed I/O pulse IOP_BG13_d and the second delayed I/O pulse IOP_BG24_d to generate a synthesized delay I/O pulse IOP_d_SUM. The synthesis I/O pulse generation circuit 71 may generate the synthesized delay I/O pulse IOP_d_SUM if any one of the first delayed I/O pulse IOP_BG13_d and the second delayed I/O pulse IOP_BG24_d is created. A configuration and an operation of the synthesis I/O pulse generation circuit 71 will be described with reference to FIG. 8 later.

The count pulse generation circuit 72 may generate a count pulse IB4_CNTP from the second delayed address latch signal LADD2d based on the synthesized I/O pulse IOP_SUM and the synthesized delay I/O pulse IOP_d_SUM. The count pulse generation circuit 72 may latch the second delayed address latch signal LADD2d to output the latched signal of the second delayed address latch signal LADD2d as the count pulse IB4_CNTP, in synchronization with the synthesized I/O pulse IOP_SUM. The count pulse generation circuit 72 may latch an inverted signal of the second delayed address latch signal LADD2d to output the latched signal of the inverted signal of the second delayed address latch signal LADD2d as the count pulse IB4_CNTP, in synchronization with the synthesized delay I/O pulse IOP_d_SUM. The count pulse IB4_CNTP may be set to have the same logic level as the second delayed address latch signal LADD2d at a point of time that the synthesized I/O pulse IOP_SUM is created and may be set to have an inverted logic level of the second delayed address latch signal LADD2d at a point of time that the synthesized delay I/O pulse IOP_d_SUM is created. A configuration and an operation of the count pulse generation circuit 72 will be described with reference to FIG. 9 later.

The sampling signal generation circuit 73 may decode the count pulse IB4_CNTP and the first delayed address latch signal LADD1d to generate a first sampling signal SAMP1, a second sampling signal SAMP2, a third sampling signal SAMP3 and a fourth sampling signal SAMP4. The sampling signal generation circuit 73 may generate the first to fourth sampling signals SAMP1~SAMP4, one of which is selectively enabled according to a logic level combination of the count pulse IB4_CNTP and the first delayed address latch signal LADD1d. Logic level combinations of the count pulse IB4_CNTP and the first delayed address latch signal LADD1d for enabling the first to fourth sampling signals SAMP1~SAMP4 may be set to be different according to the embodiments. A configuration and an operation of the sampling signal generation circuit 73 will be described with reference to FIG. 10 later.

The bank synthesis pulse generation circuit 74 may synthesize the first bank I/O pulse IOP_BG1 and the first delayed I/O pulse IOP_BG13_d to generate a first bank synthesis pulse BG1_SUMP. The bank synthesis pulse generation circuit 74 may generate the first bank synthesis pulse BG1_SUMP if any one of the first bank I/O pulse IOP_BG1 and the first delayed I/O pulse IOP_BG13_d is created. The bank synthesis pulse generation circuit 74 may synthesize the third bank I/O pulse IOP_BG3 and the first delayed I/O pulse IOP_BG13_d to generate a third bank synthesis pulse BG3_SUMP. The bank synthesis pulse generation circuit 74 may generate the third bank synthesis pulse BG3_SUMP if any one of the third bank I/O pulse IOP_BG3 and the first delayed I/O pulse IOP_BG13_d is created. The bank synthesis pulse generation circuit 74 may synthesize the second bank I/O pulse IOP_BG2 and the second delayed I/O pulse IOP_BG24_d to generate a second bank synthesis pulse BG2_SUMP. The bank synthesis pulse generation circuit 74 may generate the second bank synthesis pulse BG2_SUMP if any one of the second bank I/O pulse IOP_BG2 and the second delayed I/O pulse IOP_BG24_d is created. The bank synthesis pulse generation circuit 74 may synthesize the fourth bank I/O pulse IOP_BG4 and the second delayed I/O pulse IOP_BG24_d to generate a fourth bank synthesis pulse BG4_SUMP. The bank synthesis pulse generation circuit 74 may generate the fourth bank synthesis pulse BG4_SUMP if any one of the fourth bank I/O pulse IOP_BG4 and the second delayed I/O pulse IOP_BG24_$d$ is created. A configuration and an operation of the bank synthesis pulse generation circuit 74 will be described with reference to FIG. 11 later.

The drive control pulse generation circuit 75 may generate the first drive control pulse DCTR_BG1 based on the first bank synthesis pulse BG1_SUMP and the first sampling pulse SAMP1. The drive control pulse generation circuit 75 may generate the first drive control pulse DCTR_BG1 if the first bank synthesis pulse BG1_SUMP is created while the first sampling pulse SAMP1 is enabled. The drive control pulse generation circuit 75 may generate the second drive control pulse DCTR_BG2 based on the second bank synthesis pulse BG2_SUMP and the second sampling pulse SAMP2. The drive control pulse generation circuit 75 may generate the second drive control pulse DCTR_BG2 if the second bank synthesis pulse BG2_SUMP is created while the second sampling pulse SAMP2 is enabled. The drive control pulse generation circuit 75 may generate the third drive control pulse DCTR_BG3 based on the third bank synthesis pulse BG3_SUMP and the third sampling pulse SAMP3. The drive control pulse generation circuit 75 may generate the third drive control pulse DCTR_BG3 if the third bank synthesis pulse BG3_SUMP is created while the third sampling pulse SAMP3 is enabled. The drive control pulse generation circuit 75 may generate the fourth drive control pulse DCTR_BG4 based on the fourth bank synthesis pulse BG4_SUMP and the fourth sampling pulse SAMP4. The drive control pulse generation circuit 75 may generate the fourth drive control pulse DCTR_BG4 if the fourth bank synthesis pulse BG4_SUMP is created while the fourth sampling pulse SAMP4 is enabled. A configuration and an operation of the drive control pulse generation circuit 75 will be described with reference to FIG. 12 later.

Figure 8:
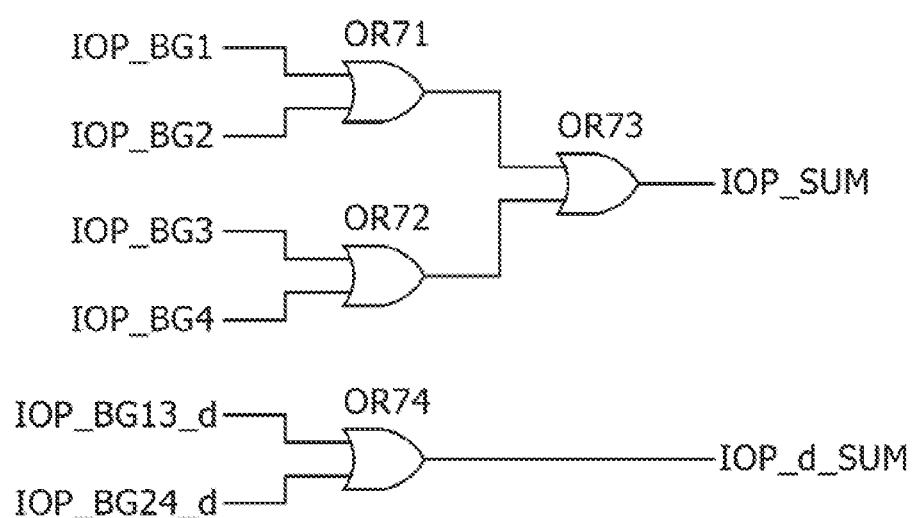
FIG. 8 is a circuit diagram illustrating an example of a synthesis I/O pulse generation circuit included in the I/O line drive control circuit of FIG. 7.

Referring to FIG. 8, the synthesis I/O pulse generation circuit 71 may be configured to perform, for example, OR operations. The synthesis I/O pulse generation circuit 71 may include, for example, OR gates OR71~OR74. The OR gate OR71 may perform a logical OR operation of the first bank I/O pulse IOP_BG1 and the second bank I/O pulse IOP_BG2. The OR gate OR72 may perform a logical OR operation of the third bank I/O pulse IOP_BG3 and the fourth bank I/O pulse IOP_BG4. The OR gate OR73 may perform a logical OR operation of an output signal of the OR gate OR71 and an output signal of the OR gate OR72 to output the result of the logical OR operation as the synthesized I/O pulse IOP_SUM. The synthesis I/O pulse generation circuit 71 may generate the synthesized I/O pulse IOP_SUM if any one of the first to fourth bank I/O pulses IOP_BG1~IOP_BG4 is created. The OR gate OR74 may perform a logic OR operation of the first delayed I/O pulse IOP_BG13_$d$ and the second delayed I/O pulse IOP_BG24_$d$ to output the result of the logical OR operation as the synthesized delay I/O pulse IOP_d_SUM. The synthesis I/O pulse generation circuit 71 may generate the synthesized delay I/O pulse IOP_d_SUM if any one of the first delayed I/O pulse IOP_BG13_$d$ and the second delayed I/O pulse IOP_BG24_$d$ is created.

Figure 9:
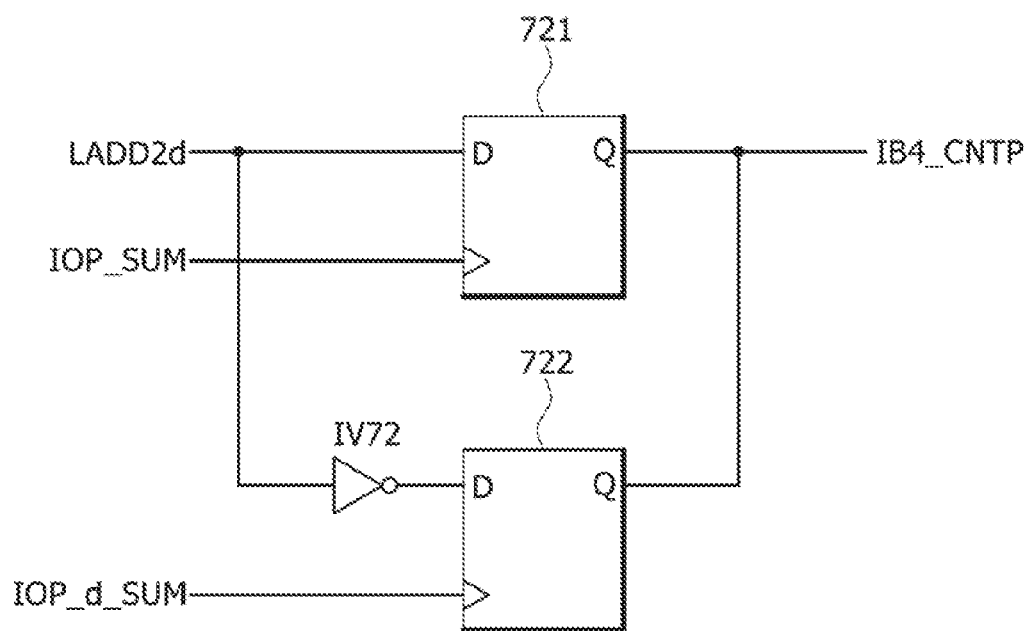
FIG. 9 is a circuit diagram illustrating an example of a count pulse generation circuit included in the I/O line drive control circuit of FIG. 7.

Referring to FIG. 9, the count pulse generation circuit 72 may include, for example, an inverter IV72, a first count flip-flop 721 and a second count flip-flop 722. The inverter IV72 may inversely buffer the second delayed address latch signal LADD2$d$ to output the inversely buffered signal of the second delayed address latch signal LADD2$d$. The first count flip-flop 721 may be synchronized with a rising edge of the synthesized I/O pulse IOP_SUM to latch the second delayed address latch signal LADD2$d$ and to output the latched signal of the second delayed address latch signal LADD2$d$ as the count pulse IB4_CNTP. The second count flip-flop 722 may be synchronized with a rising edge of the synthesized delay I/O pulse IOP_d_SUM to latch an output signal of the inverter IV72 and to output the latched signal of the output signal of the inverter IV72 as the count pulse IB4_CNTP. The count pulse generation circuit 72 may generate the count pulse IB4_CNTP which is set to have the same logic level as the second delayed address latch signal LADD2$d$ at a point of time that the synthesized I/O pulse IOP_SUM is created and may generate the count pulse IB4_CNTP which is set to have an inverted level of the second delayed address latch signal LADD2$d$ at a point of time that the synthesized delay I/O pulse IOP_d_SUM is created.

Figure 10:
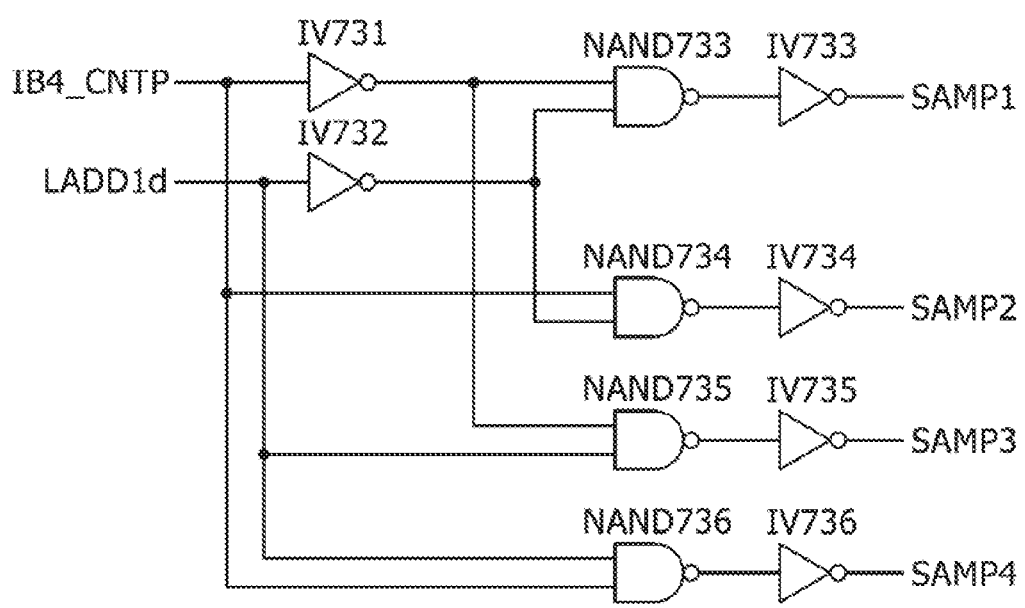
FIG. 10 is a circuit diagram illustrating an example of a sampling signal generation circuit included in the I/O line drive control circuit of FIG. 7.

Referring to FIG. 10, the sampling signal generation circuit 73 may be configured, for example, to perform inversion and NAND operations. For example, the sampling signal generation circuit 73 may be configured to include, for example, inverters IV731~IV736 and NAND gates NAND733~NAND736. The inverter IV731 may inversely buffer the count pulse IB4_CNTP. The inverter IV732 may inversely buffer the first delayed address latch signal LADD1$d$. The NAND gate NAND733 and the inverter IV733 may perform a logical AND operation of an output signal of the inverter IV731 and an output signal of the inverter IV732 to output the result of the logical AND operation as the first sampling signal SAMP1. The NAND gate NAND734 and the inverter IV734 may perform a logical AND operation of the count pulse IB4_CNTP and an output signal of the inverter IV732 to output the result of the logical AND operation as the second sampling signal SAMP2. The NAND gate NAND735 and the inverter IV735 may perform a logical AND operation of the first delayed address latch signal LADD1$d$ and an output signal of the inverter IV731 to output the result of the logical AND operation as the third sampling signal SAMP3. The NAND gate NAND736 and the inverter IV736 may perform a logical AND operation of the count pulse IB4_CNTP and the first delayed address latch signal LADD1$d$ to output the result of the logical AND operation as the fourth sampling signal SAMP4. The sampling signal generation circuit 73 may generate the first sampling signal SAMP1 which is enabled to have a logic "high" level while the count pulse IB4_CNTP has a logic "low" level and the first delayed address latch signal LADD1$d$ has a logic "low" level. The sampling signal generation circuit 73 may generate the second sampling signal SAMP2 which is enabled to have a logic "high" level while the count pulse IB4_CNTP has a logic "high" level and the first delayed address latch signal LADD1$d$ has a logic "low" level. The sampling signal generation circuit 73 may generate the third sampling signal SAMP3 which is enabled to have a logic "high" level while the count pulse IB4_CNTP has a logic "low" level and the first delayed address latch signal LADD1$d$ has a logic "high" level. The sampling signal generation circuit 73 may generate the fourth sampling signal SAMP4 which is enabled to have a logic "high" level while the count pulse IB4_CNTP has a logic "high" level and the first delayed address latch signal LADD1$d$ has a logic "high" level.

Figure 11:
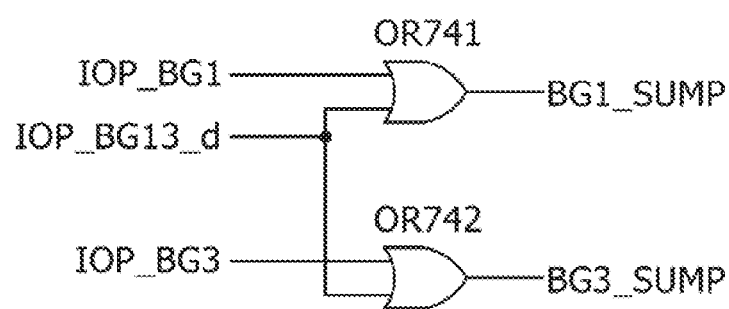
FIG. 11 is a circuit diagram illustrating an example of a bank synthesis pulse generation circuit included in the I/O line drive control circuit of FIG. 7.
Figure 11:
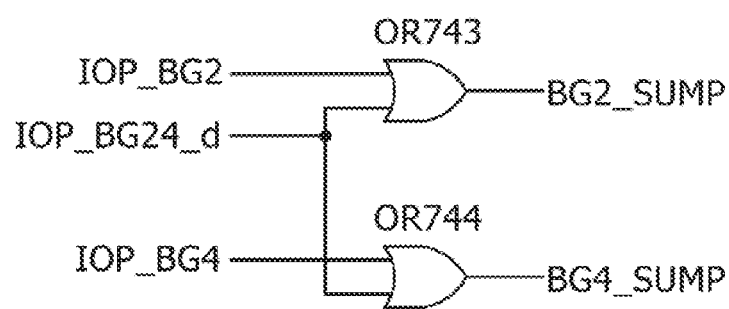

Referring to FIG. 11, the bank synthesis pulse generation circuit 74 may be configured, for example, to perform OR operations. For example, the bank synthesis pulse generation circuit 74 may include OR gates OR741'OR744. The OR gate OR741 may perform a logical OR operation of the first bank I/O pulse IOP_BG1 and the first delayed I/O pulse IOP_BG13_d to generate the first bank synthesis pulse BG1_SUMP. The OR gate OR741 may generate the first bank synthesis pulse BG1_SUMP if any one of the first bank I/O pulse IOP_BG1 and the first delayed I/O pulse IOP_BG13_d is created. The OR gate OR742 may perform a logical OR operation of the third bank I/O pulse IOP_BG3 and the first delayed I/O pulse IOP_BG13_d to generate the third bank synthesis pulse BG3_SUMP. The OR gate OR742 may generate the third bank synthesis pulse BG3_SUMP if any one of the third bank I/O pulse IOP_BG3 and the first delayed I/O pulse IOP_BG13_d is created. The OR gate OR743 may perform a logical OR operation of the second bank I/O pulse IOP_BG2 and the second delayed I/O pulse IOP_BG24_d to generate the second bank synthesis pulse BG2_SUMP. The OR gate OR743 may generate the second bank synthesis pulse BG2_SUMP if any one of the second bank I/O pulse IOP_BG2 and the second delayed I/O pulse IOP_BG24_d is created. The OR gate OR744 may perform a logical OR operation of the fourth bank I/O pulse IOP_BG4 and the second delayed I/O pulse IOP_BG24_d to generate the fourth bank synthesis pulse BG4_SUMP. The OR gate OR744 may generate the fourth bank synthesis puke BG4_SUMP if any one of the fourth bank I/O pulse IOP_BG4 and the second delayed I/O pulse IOP_BG24_d is created.

Figure 12:
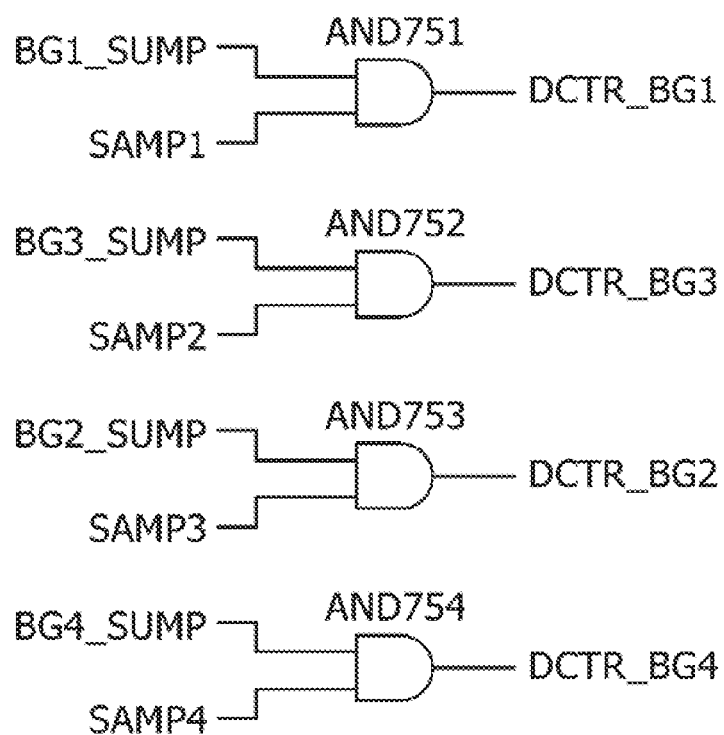
FIG. 12 is a circuit diagram illustrating an example of a drive control pulse generation circuit included in the I/O line drive control circuit of FIG. 7.

Referring to FIG. 12, the drive control pulse generation circuit 75 may be configured to perform, for example, AND operations. For example, the drive control pulse generation circuit 75 may include AND gates AND751~AND754. The AND gate AND751 may perform a logical AND operation of the first bank synthesis pulse BG1_SUMP and the first sampling signal SAMP1 to generate the first drive control pulse DCTR_BG1. The AND gate AND751 may generate the first drive control pulse DCTR_BG1 if the first bank synthesis pulse BG1_SUMP is created while the first sampling signal SAMP1 is enabled to have a logic "high" level. The AND gate AND752 may perform a logical AND operation of the third bank synthesis pulse BG3_SUMP and the second sampling signal SAMP2 to generate the third drive control pulse DCTR_BG3. The AND gate AND752 may generate the third drive control pulse DCTR_BG3 if the third bank synthesis pulse BG3_SUMP is created while the second sampling signal SAMP2 is enabled to have a logic "high" level. The AND gate AND753 may perform a logical AND operation of the second bank synthesis pulse BG2_SUMP and the third sampling signal SAMP3 to generate the second drive control pulse DCTR_BG2. The AND gate AND753 may generate the second drive control pulse DCTR_BG2 if the second bank synthesis pulse BG2_SUMP is created while the third sampling signal SAMP3 is enabled to have a logic "high" level. The AND gate AND754 may perform a logical AND operation of the fourth bank synthesis pulse BG4_SUMP and the fourth sampling signal SAMP4 to generate the fourth drive control pulse DCTR_BG4. The AND gate AND754 may generate the fourth drive control pulse DCTR_BG4 if the fourth bank synthesis pulse BG4_SUMP is created while the fourth sampling signal SAMP4 is enabled to have a logic "high" level.

Figure 13:
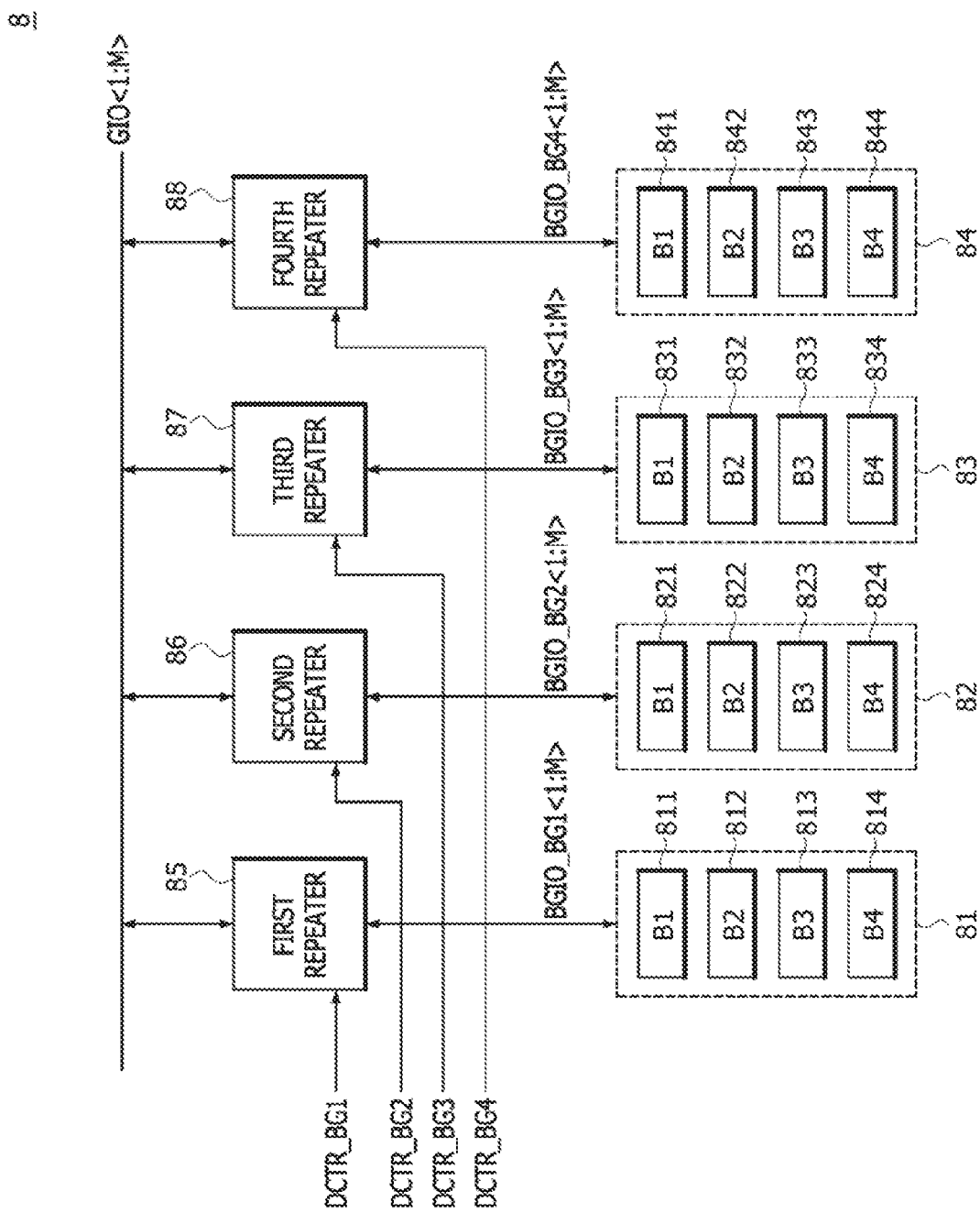
FIG. 13 is a block diagram illustrating an example of a data I/O circuit included in the semiconductor device of FIG. 1.

Referring to FIG. 13, the data I/O circuit 8 may include a first bank group 81, a second bank group 82, a third bank group 83, a fourth bank group 84, a first repeater 85, a second repeater 86, a third repeater 87 and a fourth repeater 88. The first bank group 81 may include first to fourth banks 811~814. The second bank group 82 may include first to fourth banks 821~824. The third bank group 83 may include first to fourth banks 831~834. The fourth bank group 84 may include first to fourth banks 841~844. The first repeater 85 may receive the first drive control pulse DCTR_BG1 generated during a read operation to amplify first I/O data BGIO_BG1<1:M> outputted from the first to fourth banks 811814 included in the first bank group 81 and to output the amplified data of the first I/O data BGIO_BG1<1:M> through an I/O line GIO<1:M>. The first repeater 85 may amplify data inputted through the I/O line GIO<1:M> based on the first drive control pulse DCTR_BG1 generated during a write operation to generate the first I/O data BGIO_BG1<1:M> to be stored into the first to fourth banks 811~814 included in the first bank group 81. The second repeater 86 may receive the second drive control pulse DCTR_BG2 generated during the read operation to amplify second I/O data BGIO_BG2<1:M> outputted from the first to fourth banks 821~824 included in the second bank group 82 and to output the amplified data of the second I/O data BGIO_BG2<1:M> through the I/O line GIO<1:M>. The second repeater 86 may amplify data inputted through the I/O line GIO<1:M> based on the second drive control pulse DCTR_BG2 generated during the write operation to generate the second I/O data BGIO_BG2<1:M> to be stored into the first to fourth banks 821824 included in the second bank group 82. The third repeater 87 may receive the third drive control pulse DCTR_BG3 generated during the read operation to amplify third I/O data BGIO_BG3<1:M> outputted from the first to fourth banks 831~834 included in the third bank group 83 and to output the amplified data of the third I/O data BGIO_BG3<1:M> through the I/O line GIO<1:M>. The third repeater 87 may amplify data inputted through the I/O line GIO<1:M> based on the third drive control pulse DCTR_BG3 generated during the write operation to generate the third I/O data BGIO_BG3<1:M> to be stored into the first to fourth banks 831~834 included in the third bank group 83. The fourth repeater 88 may receive the fourth drive control pulse DCTR_BG4 generated during the read operation to amplify fourth I/O data BGIO_BG4<1:M> outputted from the first to fourth banks 841~844 included in the fourth bank group 84 and to output the amplified data of the fourth I/O data BGIO_BG4<1:M> through the I/O line GIO<1:M>. The fourth repeater 88 may amplify data inputted through the I/O line GIO<1:M> based on the fourth drive control pulse DCTR_BG4 generated during the write operation to generate the fourth I/O data BGIO_BG4<1:M> to be stored into the first to fourth banks 841~844 included in the fourth bank group 84.

An operation of the semiconductor device having an aforementioned configuration will be described hereinafter with reference to FIGS. 14 to 16. It may be assumed that points of time "T3" illustrated in FIGS. 14 to 16 denote the same point of time and points of time "T4" illustrated in FIGS. 14 to 16 denote the same point of time. Moreover, it may be assumed that points of time "T5" illustrated in FIGS. 14 to 16 denote the same point of time and points of time "T6" illustrated in FIGS. 14 to 16 denote the same point of time.

Figure 14:
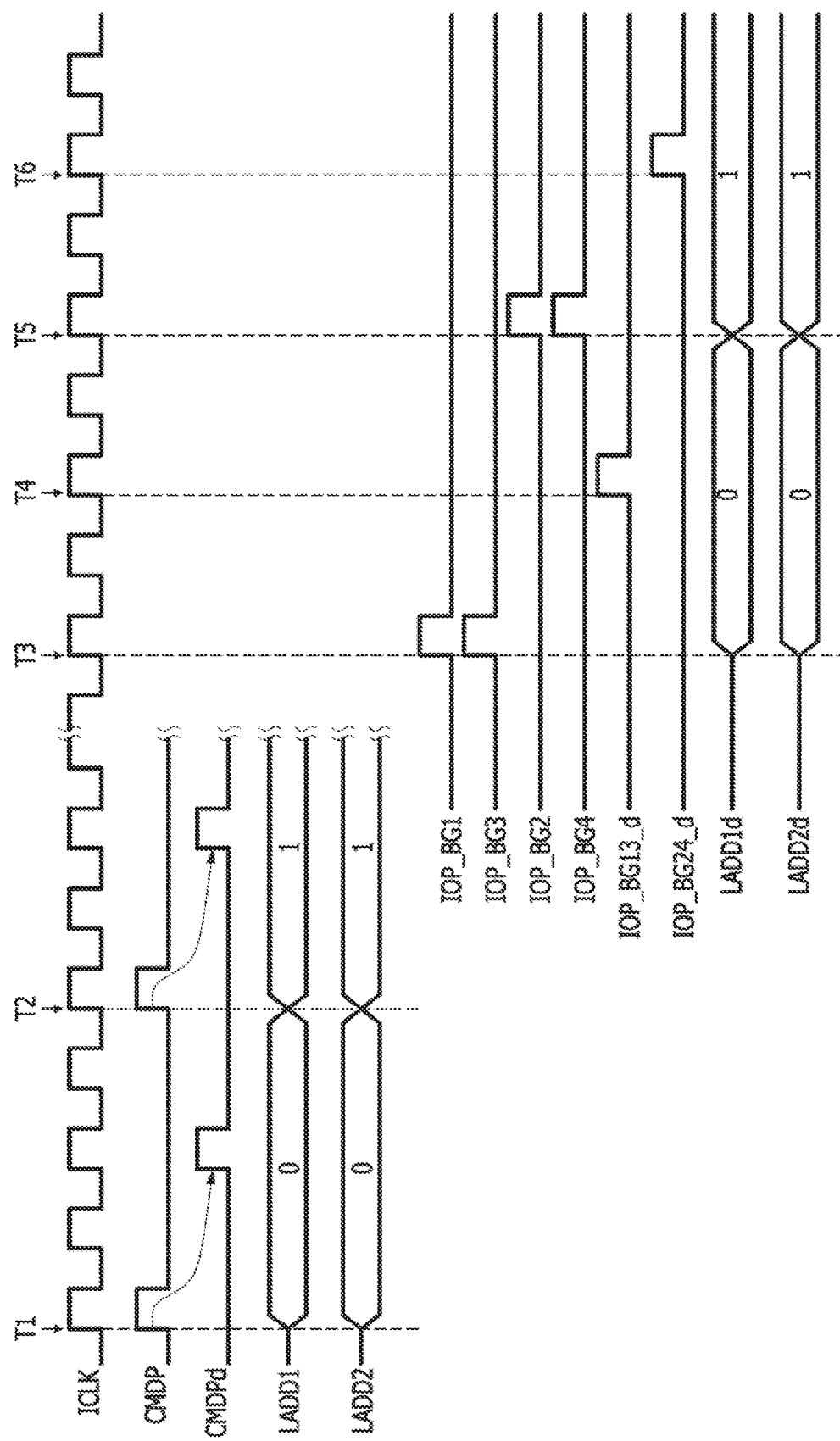
FIGS. 14 to 16 are timing diagrams illustrating an operation of the semiconductor device shown in FIGS. 1 to 13.

As illustrated in FIG. 14, both of the first address latch signal LADD1 and the second address latch signal LADD2 may be set to have a logic "low" level when the command pulse CMDP for the read operation is created at a point of time "T1", and both of the first address latch signal LADD1 and the second address latch signal LADD2 may be set to have a logic "high" level when the command pulse CMDP for the read operation is created at a point of time "T2". In FIG. 14, '0' means a logic "low" level and '1' means a logic "high" level. The delayed command pulse CMDPd may be generated at a point of time that a period corresponding to two cycles of the internal clock signal ICLK elapses from a point of time that the command pulse CMDP is created. During a period (in which the first address latch signal LADD1 has a logic "low" level) from the point of time "T1" till the point of time "T2", the command pulse CMDP may be delayed by a predetermined delay period to provide the first and third bank I/O pulses IOP_BG1 and IOP_BG3 which are generated at the point of time "T3" and the delayed command pulse CMDPd may be delayed by a predetermined period to provide the first delayed I/O pulse IOP_BG13_d which is generated at the point of time "T4". After the point of time "T2" that the first address latch signal LADD1 has a logic "high" level, the command pulse CMDP may be delayed by a predetermined delay period to provide the second and fourth bank I/O pulses IOP_BG2 and IOP_BG4 which are generated at the point of time "T5" and the delayed command pulse CMDPd may be delayed by a predetermined delay period to provide the second delayed I/O pulse IOP_BG24_d which is generated at the point of time "T6". The first address latch signal LADD1 may be delayed by a predetermined delay period to provide the first delayed address latch signal LADD1d, and the second address latch signal LADD2 may be delayed by a predetermined delay period to provide the second delayed address latch signal LADD2d. In the present embodiment, the predetermined delay periods of the command pulse CMDP, the delayed command pulse CMDPd, the first address latch signal LADD1 and the second address latch signal LADD2 may be set to be equal to each other.

The word "predetermined" as used herein with respect to a parameter, such as a predetermined delay period, means that a value for the parameter is determined prior to the parameter being used in a process or algorithm. For some embodiments, the value for the parameter is determined before the process or algorithm to begins. In other embodiments, the value for the parameter is determined during the process or algorithm but before the parameter is used in the process or algorithm.

Figure 15:
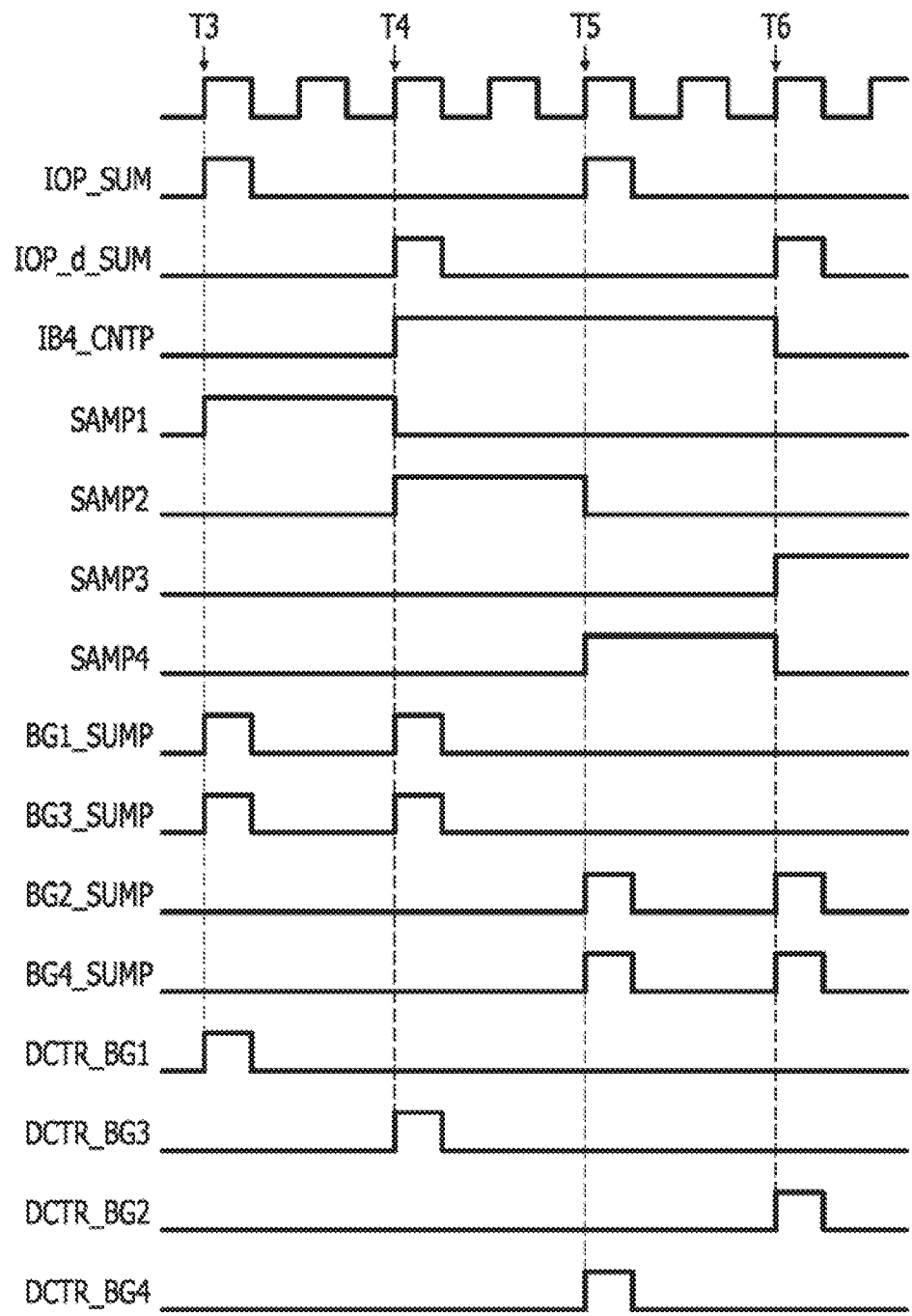

As illustrated in FIG. 15, the synthesized I/O pulse IOP_SUM may be generated at the points of time "T3" and "T5" by synthesizing the first to fourth bank I/O pulses IOP_BG1, IOP_BG2, IOP_BG3 and IOP_BG4. The synthesized delay I/O pulse IOP_d_SUM may be generated at the points of time "T4" and "T6" by synthesizing the first and second delayed I/O pulses IOP_BG13_d and IOP_BG24_d. The second delayed address latch signal LADD2d having a logic "low" level may be latched in synchronization with the synthesized I/O pulse IOP_SUM at the point of time "T3" to provide the count pulse IB4_CNTP, and the second delayed address latch signal LADD2d having a logic "low" level may be inversely buffered and latched in synchronization with the synthesized delay I/O pulse IOP_d_ SUM at the point: of time "T4" to provide the count pulse IB4_CNTP. The second delayed address latch signal LADD2d having a logic "high" level may be latched in synchronization with the synthesized I/O pulse IOP_SUM at the point of time "T5" to provide the count pulse IB4_CNTP, and the second delayed address latch signal LADD2d having a logic "high" level may be inversely buffered and latched in synchronization with the synthesized delay I/O pulse IOP_d_SUM at the point of time "T6" to provide the count pulse IB4_CNTP.

As illustrated in FIG. 15, during a period from the point of time "T3" till the point of time "T4", the first sampling signal SAMP1 may be enabled to have a logic "high" level by the count pulse IB4_CNTP having a logic "low" level and the first delayed address latch signal LADD1d having a logic "low" level. During a period from the point of time "T4" till the point of time "T5", the second sampling signal SAMP2 may be enabled to have a logic "high" level by the count pulse IB4_CNTP having a logic "high" level and the first delayed address latch signal LADD1d having a logic "low" level. During a period from the point of time "T5" till the point of time "T6", the fourth sampling signal SAMP4 may be enabled to have a logic "high" level by the count pulse IB4_CNTP having a logic "high" level and the first delayed address latch signal LADD1d having a logic "high" level. After the point of time "T6", the third sampling signal SAMP3 may be enabled to have a logic "high" level by the count pulse IB4_CNTP having a logic "low" level and the first delayed address latch signal LADD1d having a logic "high" level.

As illustrated in FIG. 15, the first bank synthesis pulse BG1_SUMP may be generated at the point of time "T3" that the first bank I/O pulse IOP_BG1 is created and at the point of time "T4" that the first delayed I/O pulse IOP_BG13_d is created, and the third bank synthesis pulse BG3_SUMP may be generated at the point of time "T3" that the third bank I/O pulse IOP_BG3 is created and at the point of time "T4" that the first delayed I/O pulse IOP_BG13_d is created. The second bank synthesis pulse BG2_SUMP may be generated at the point of time "T5" that the second bank I/O pulse IOP_BG2 is created and at the point of time "T6" that the second delayed I/O pulse IOP_BG24_d is created, and the fourth bank synthesis pulse BG4_SUMP may be generated at the point of time "T5" that the fourth bank I/O pulse IOP_BG4 is created and at the point of time "T6" that the second delayed I/O pulse IOP_BG24_d is created.

As illustrated in FIG. 15, the first drive control pulse DCTR_BG1 may be generated at the point of time "T3" by the first bank synthesis pulse BG1_SUMP which is sampled by the first sampling signal SAMP1 having a logic "high" level. The third drive control pulse DCTR_BG3 may be generated at the point of time "T4" by the third bank synthesis pulse BG3_SUMP which is sampled by the second sampling signal SAMP2 having a logic "high" level. The fourth drive control pulse DCTR_BG4 may be generated at the point of time "T5" by the fourth bank synthesis pulse BG4_SUMP which is sampled by the fourth sampling signal SAMP4 having a logic "high" level. The second drive control pulse DCTR_BG2 may be generated at the point of time "T6" by the second bank synthesis pulse BG2_SUMP which is sampled by the third sampling signal SAMP3 having a logic "high" level.

Figure 16:
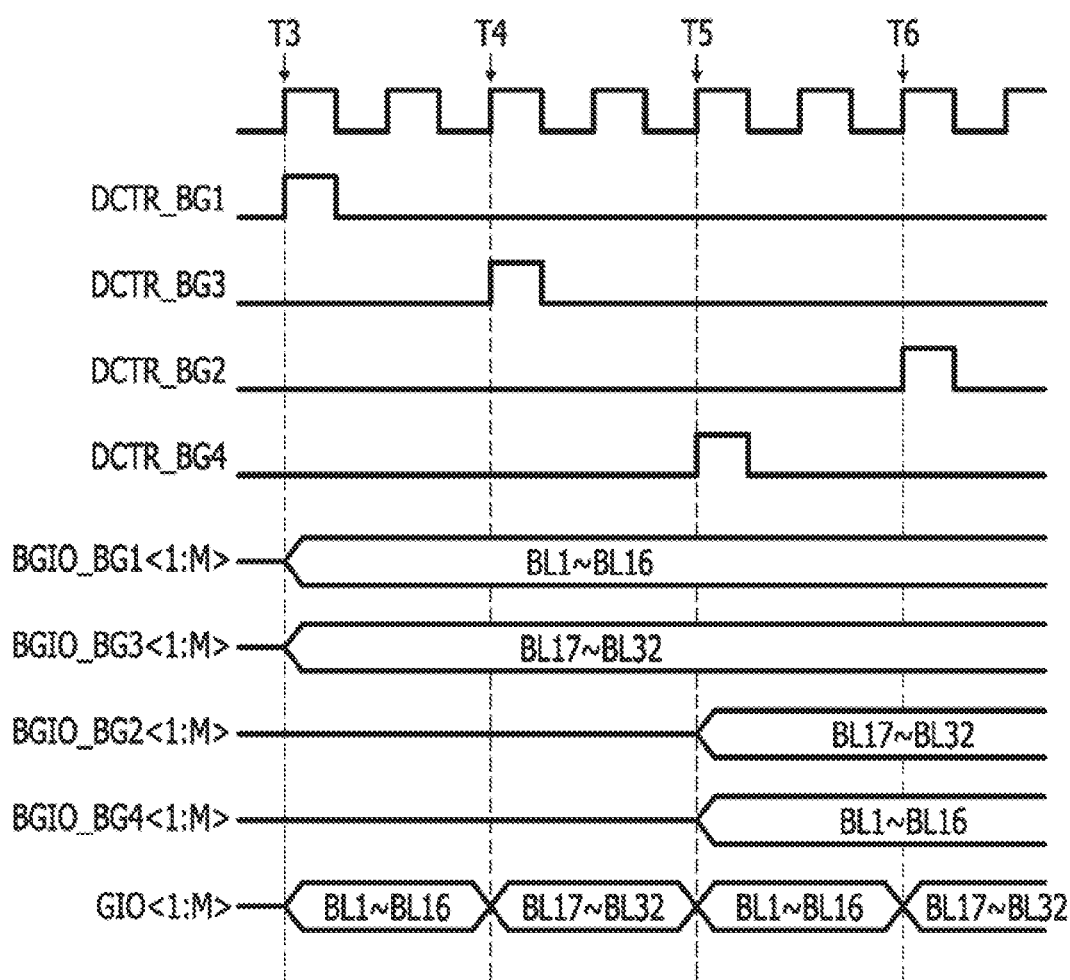

As illustrated in FIG. 16, the first I/O data BGIO_BG1<1: M> outputted from the first bank group 81 may be amplified by the first drive control pulse DCTR_BG1 generated at the point of time "T3", to and the amplified data of the first I/O data BGIO_BG1<1:M> may be outputted through the I/O line GIO<1:M>. The third I/O data BGIO_BG3<1:M> outputted from the third bank group 83 may be amplified by the third drive control pulse DCTR_BG3 generated at the point of time "T4", and the amplified data of the third I/O data BGIO_BG3<1:M> may be outputted through the I/O line GIO<1:M>, While a burst length is set to be '32', the first I/O data BGIO_BG1<1:M> having sixteen bits (e.g., BL1~BL16) may be outputted at the point of time "T3" through the I/O line GIO<1:M> and the third I/O data BGIO_BG3<1:M> having sixteen bits (e.g., BL17~BL32) may then be outputted at the point of time "T4" through the I/O line GIO<1:M>. The fourth I/O data BGIO_BG4<1:M> outputted from the fourth bank group 84 may be amplified by the fourth drive control pulse DCTR_BG4 generated at the point of time "T5", and the amplified data of the fourth I/O data BGIO_BG4<1:M> may be outputted through the I/O line GIO<1:M>. The second I/O data BGIO_BG2<1:M> outputted from the second bank group 82 may be amplified by the second drive control pulse DCTR_BG2 generated at the point of time "T6", and the amplified data of the second I/O data BGIO_BG2<1:M> may be outputted through the I/O line GIO<1:M>. While the burst length is set to be '32', the fourth I/O data BGIO_BG4<1:M> having sixteen bits (e.g., BL1~BL16) may be outputted at the point of time "T5" through the I/O line GIO<1:M> and the second I/O data BGIO_BG2<1:M> having sixteen bits (e.g., BL17~BL32) may then be outputted at the point of time "T6" through the I/O line GIO<1:M>.

Although FIGS. 14 to 16 illustrates the read operation of the semiconductor device described with reference to FIGS. 1 to 13 while the burst length is set to be '32', the present disclosure is not limited thereto. For example, in some other embodiments, the present disclosure may also be applied to the write operation of the semiconductor device while the burst length is set to be equal to or different from '32'.

As described above, a semiconductor device according to an embodiment may sequentially perform read operations or write operations for a plurality of bank groups whenever the command pulse CMDP is created. Thus, operation time and power consumption of the semiconductor device may be reduced by sequentially executing data I/O operations of the plurality of bank groups with a circuit for executing the data I/O operation of one bank group, as compared with a case that data I/O operations for a plurality of bits are simultaneously executed. In addition, the semiconductor device may control a sequence of data I/O operations for a plurality of bank groups according to a logic level combination of the first address ADD1 and the second address ADD2 extracted from the external control signal CA<1:L>. For example, as illustrated in FIGS. 14 to 16, the semiconductor device may control a sequence of the data I/O operations for the first to fourth bank groups 81, 82, 83 and 84 such that the first I/O data BGIO_BG1<1:M> stored in the first bank group 81, the third I/O data BGIO_BG3<1:M> stored in the third bank group 83, the fourth I/O data BGIO_BG4<1:M> stored in the fourth bank group 84, and the second I/O data BGIO_BG2<1:M> stored in the second bank group 82 may be sequentially outputted. Alternatively, a sequence of the data I/O operations for the bank groups may be controlled by an external signal or an internal signal instead of the addresses.

Figure 17:
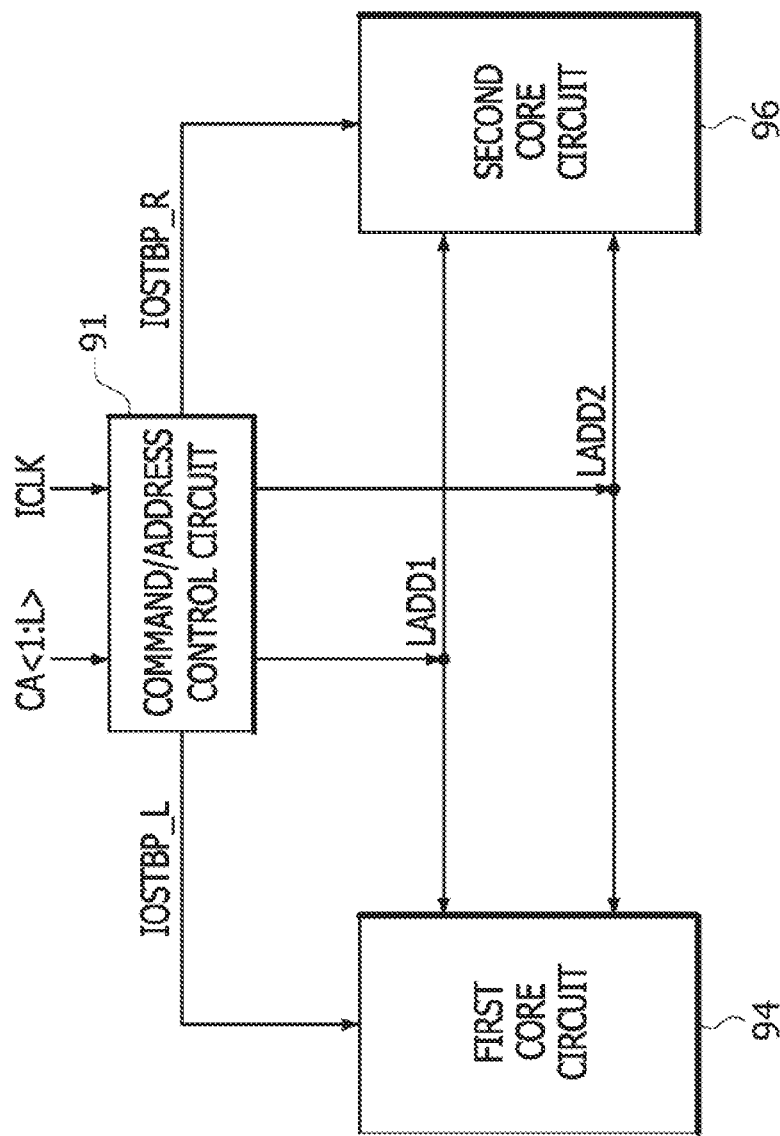
FIG. 17 is a block diagram illustrating a configuration of a semiconductor device according to an embodiment of the present disclosure.

Referring to FIG. 17, a semiconductor device according to other embodiments may include a command/address control circuit 91, a first core circuit 94 and a second core circuit 96.

The command/address control circuit 91 may generate a first I/O control pulse IOSTBP_L, a second I/O control pulse IOSTBP_R, a first address latch signal LADD1 and a second address latch signal LADD2 based on an external control signal CA<1:L> and an internal clock signal ICLK. The command/address control circuit 91 may generate the first I/O control pulse IOSTBP_L and the second I/O control pulse IOSTBP_R, one of which is selectively created on the basis of information included in the external control signal CA<1:L> if a read operation or a write operation is performed. The command/address control circuit 91 may latch information extracted from the external control signal CA<1:L> in synchronization with the internal clock signal ICLK to generate the first and second address latch signals LADD1 and LADD2. A configuration and an operation of the command/address control circuit 91 will be described with reference to FIGS. 18 to 22 later.

The first core circuit 94 may control a sequence of data I/O operations of bank groups (9441~9444 of FIG. 27) included in the first core circuit 94 based on the first I/O control pulse IOSTBP_L, the first address latch signal LADD1 and the second address latch signal LADD2. A configuration and an operation of the first core circuit 94 will be described with reference to FIGS. 23 to 27 later.

The second core circuit 96 may control a sequence of data I/O operations of bank groups (not shown) included in the second core circuit 96 based on the second I/O control pulse IOSTBP_R, the first address latch signal LADD1 and the second address latch signal LADD2. A configuration and an operation of the second core circuit 96 are similar to a configuration and an operation of the first core circuit 94. Thus, a detailed description of the second core circuit 96 will be omitted hereinafter. Each of the first and second core circuits 94 and 96 may include a data pad portion (not shown) through which 8-bit data are simultaneously inputted or outputted.

Figure 18:
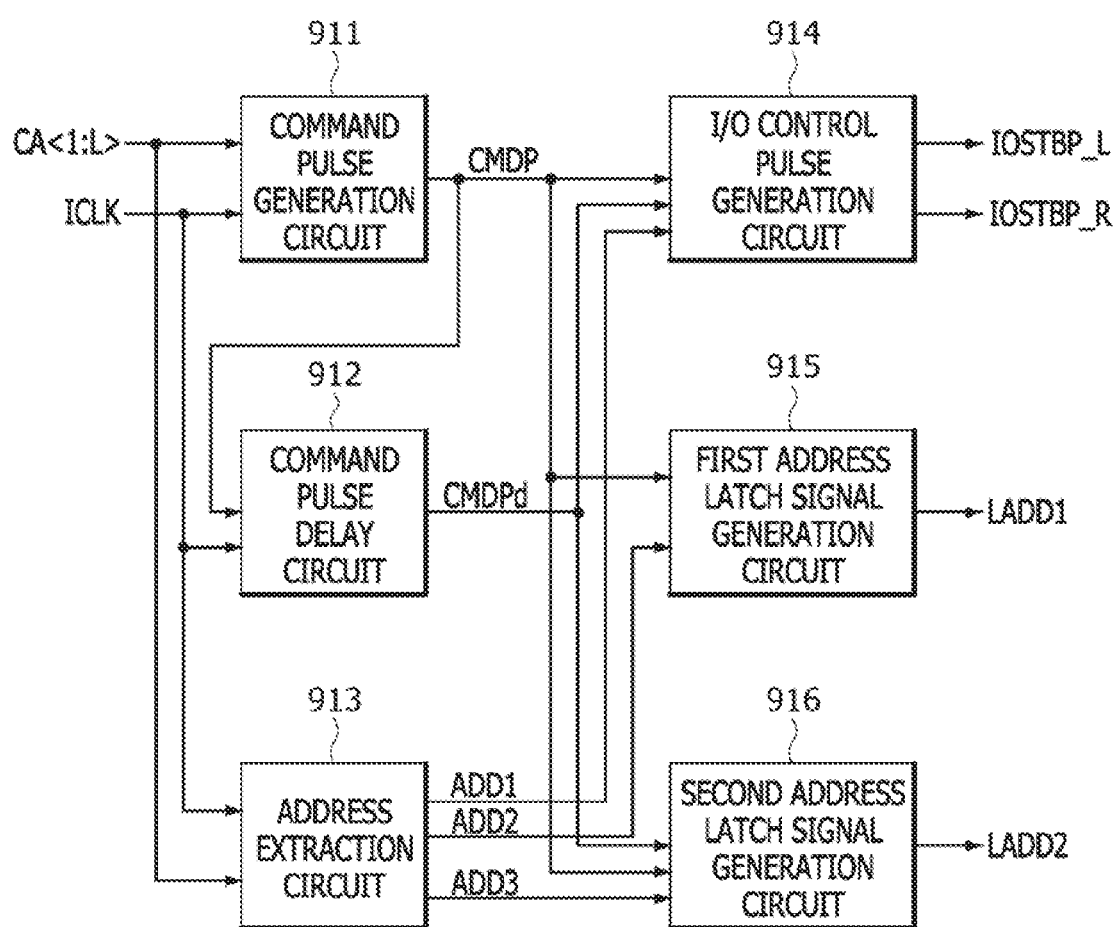
FIG. 18 is a block diagram illustrating an example of a command/address control circuit included in the semiconductor device of FIG. 17.

Referring to FIG. 18, the command/address control circuit 91 may include a command pulse generation circuit 911, a command pulse delay circuit 912, an address extraction circuit 913, an I/O control pulse generation circuit 914, a first address latch signal generation circuit 915 and a second address latch signal generation circuit 916.

The command pulse generation circuit 911 may generate a command pulse CMDP based on the external control signal CA<1:L> and the internal clock signal ICLK. The external control signal CA<1:L> may include a command and an address that are provided by an external device. The internal clock signal ICLK may be toggled in synchronization with a predetermined edge of a clock signal (not shown) that is provided by the external device or another external device. For example, the internal clock signal ICLK may be toggled in synchronization with a rising edge of the clock signal (not shown). The number 'L' of bits included in the external control signal CA<1:L> may be set to be different according to the embodiments. The external control signal CA<1:L> may be replaced with a signal which is generated by a circuit in the semiconductor device in some embodiments, and the internal clock signal ICLK may be replaced with a clock signal provided by the external device in some embodiments.

The command pulse generation circuit 911 may generate the command pulse CMDP at a point of time that the external control signal CA<1:L> having a predetermined logic level combination is inputted to the command pulse generation circuit 911 in synchronization with the internal clock signal ICLK. The command pulse CMDP may be generated to perform the read operation or the write operation according to the embodiments. The command pulse generation circuit 911 may decode the external control signal CA<1:L> to generate the command pulse CMDP.

The command pulse delay circuit 912 may generate a delayed command pulse CMDPd from the command pulse CMDP based on the internal clock signal ICLK. The command pulse delay circuit 912 may delay the command pulse CMDP by a predetermined delay period set by the internal clock signal ICLK to generate the delayed command pulse CMDPd. A configuration and an operation of the command pulse delay circuit 912 will be described with reference to FIG. 19 later.

The address extraction circuit 913 may generate a first address ADD1, a second address ADD2 and a third address ADD3 from the external control signal CA<1:L> based on the internal clock signal ICLK. The address extraction circuit 913 may output the data of predetermined bits of the external control signal CA<1:L> inputted to the address extraction circuit 913 in synchronization with the internal clock signal ICLK as the first address ADD1. The predetermined bits of the external control signal CA<1:L> to be outputted as the first address ADD1 may be set to be different according to the embodiments. The address extraction circuit 913 may output the data of predetermined bits of the external control signal CA<1:L> inputted to the address extraction circuit 913 in synchronization with the internal clock signal ICLK as the second address ADD2. The predetermined bits of the external control signal CA<1:L> to be outputted as the second address ADD2 may be set to be different according to the embodiments. The address extraction circuit 913 may output the data of predetermined bits of the external control signal CA<1:L> inputted to the address extraction circuit 913 in synchronization with the internal clock signal ICLK as the third address ADD3. The predetermined bits of the external control signal CA<1:L> to be outputted as the third address ADD3 may be set to be different according to the embodiments.

The I/O control pulse generation circuit 914 may generate the first I/O control pulse IOSTBP_L and the second I/O control pulse IOSTBP_R from the command pulse CMDP and the delayed command pulse CMDPd based on a logic level of the first address ADD1. The I/O control pulse generation circuit 914 may generate the first I/O control pulse IOSTBP_L whenever the command pulse CMDP or the delayed command pulse CMDPd is created if the first address ADD1 has a first logic level. The I/O control pulse generation circuit 914 may generate the second I/O control pulse IOSTBP_R whenever the command pulse CMDP or the delayed command pulse CMDPd is created if the first address ADD1 has a second logic level. In the present embodiment, the first logic level may be set as a logic "low" level and the second logic level may be set as a logic "high" level. A configuration and an operation of the I/O control pulse generation circuit 914 will be described with reference to FIG. 20 later.

The first address latch signal generation circuit 915 may latch the second address ADD2 to output the latched second address as the first address latch signal LADD1, based on the command pulse CMDP. A configuration and an operation of the first address latch signal generation circuit 915 will be described with reference to FIG. 21 later.

The second address latch signal generation circuit 916 may latch the third address ADDS to output the latched third address as the second address latch signal LADD2, based on the command pulse CMDP. The second address latch signal generation circuit 916 may latch the second address latch signal LADD2 based on the command pulse CMDP and may inversely buffer the latched signal of the second address latch signal LADD2 based on the delayed command pulse CMDPd to output the inversely buffered signal as the second address latch signal LADD2. A configuration and an operation of the second address latch signal generation circuit 916 will be described with reference to FIG. 22 later.

Figure 19:
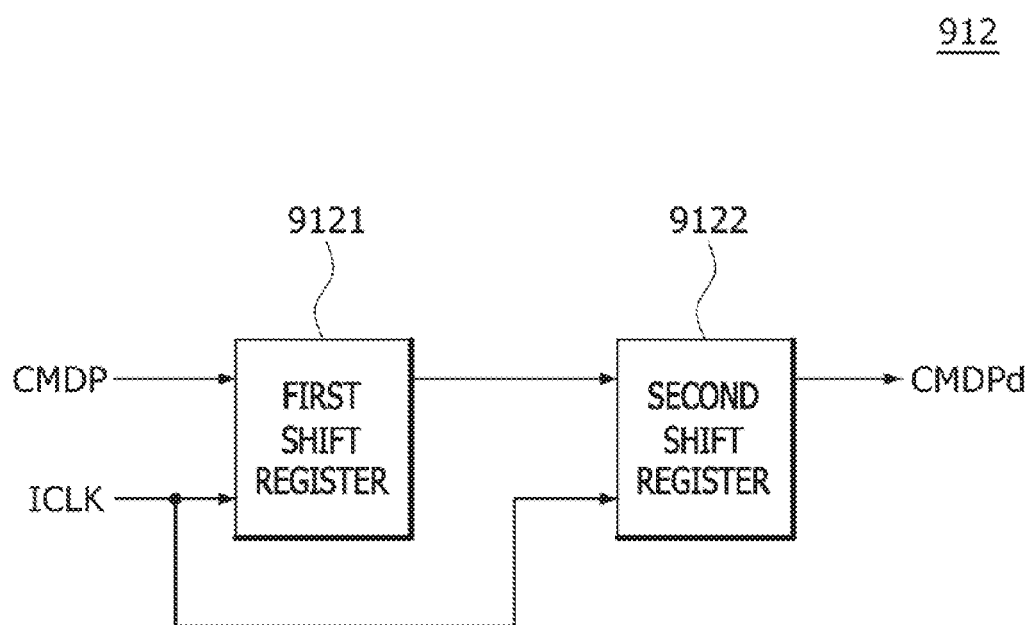
FIG. 19 is a block diagram illustrating an example of a command pulse delay circuit included in the command/address control circuit of FIG. 18.

Referring to FIG. 19, the command pulse delay circuit 912 may include, for example, a first shift register 9121 and a second shift register 9122. The first shift register 9121 may shift the command pulse CMDP by one cycle of the internal clock signal ICLK. The second shift register 9122 may shift an output signal of the first shift register 9121 by one cycle of the internal clock signal ICLK, The command pulse delay circuit 912 may delay the command pulse CMDP by a period corresponding to two cycles of the internal clock signal ICLK to generate the delayed command pulse CMDPd.

Figure 20:
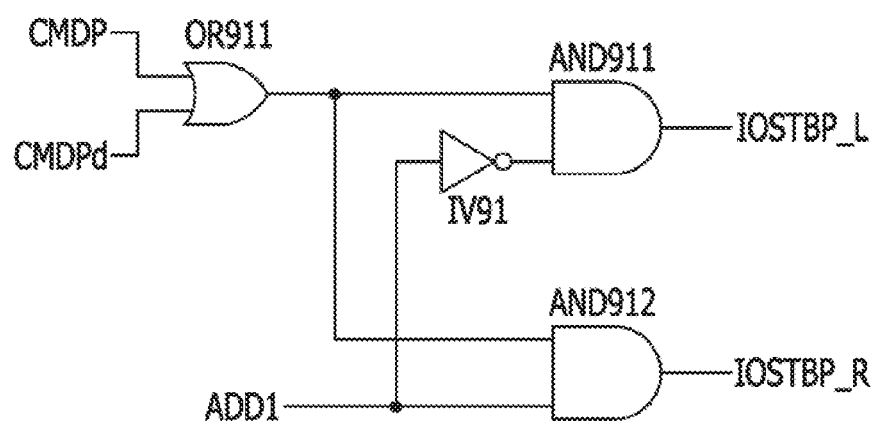
FIG. 20 is a circuit diagram illustrating an example of an I/O control pulse generation circuit included in the command/address control circuit of FIG. 18.

Referring to FIG. 20, the I/O control pulse generation circuit 914 may be configured to perform OR, inversion, and AND operations. For example, the I/O control pulse generation circuit 914 may include an OR gate OR911, an inverter IV91 and AND gates AND911 and AND912. The OR gate OR911 may perform a logical OR operation of the command pulse CMDP and the delayed command pulse CMDPd to output the result of the logical OR operation. The inverter IV91 may inversely buffer the first address ADD1 to output the inversely buffered signal of the first address ADD1. The AND gate AND911 may perform a logical AND operation of an output signal of the OR gate OR911 and an output signal of the inverter IV91 to generate the first I/O control pulse IOSTBP_L. The AND gate AND912 may perform a logical AND operation of the first address ADD1 and an output signal of the OR gate OR911 to generate the second I/O control pulse IOSTBP_R. The I/O control pulse generation circuit 914 may generate the first I/O control pulse IOSTBP_L whenever the command pulse CMDP or the delayed command pulse CMDPd is created if the first address ADD1 has a logic "low" level. The I/O control pulse generation circuit 914 may generate the second I/O control pulse IOSTBP_R whenever the command pulse CMDP or the delayed command pulse CMDPd is created if the first address ADD1 has a logic "high" level.

Figure 21:
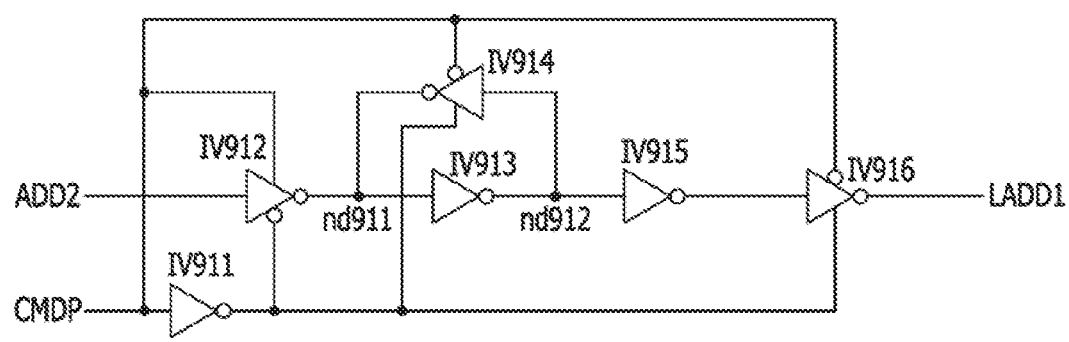
FIG. 21 is a circuit diagram illustrating an example of a first address latch signal generation circuit included in the command/address control circuit of FIG. 18.

Referring to FIG. 21, the first address latch signal generation circuit 915 may be configured to perform inversion operation. For example, the first address latch signal generation circuit 915 may include inverters IV911~IV916. The inverter IV911 may inversely buffer the command pulse CMDP to output the inversely buffered signal of the command pulse CMDP. The inverter IV912 may inversely buffer the second address ADD2 to output the inversely buffered signal of the second address ADD2 to a node nd911 if the command pulse CMDP has a logic "high" level. The inverter IV913 may inversely buffer a signal of the node nd911 to output the inversely buffered signal of the signal of the node nd911 to a node nd912. The inverter IV914 may inversely buffer a signal of the node nd912 to output the inversely buffered signal of the signal of the node nd912 to the node nd911 after the command pulse CMDP is created. The inverter IV915 may inversely buffer a signal of the node nd912 to output the inversely buffered signal of the signal of the node nd912. The inverter IV916 may inversely buffer an output signal of the inverter IV915 to output the inversely buffered signal of the output signal of the inverter IV915 as the first address latch signal LADD1 after the command pulse CMDP is created. The first address latch signal generation circuit 915 may latch the second address ADD2 to output the latched address of the second address ADD2 as the first address latch signal LADD1 if the command pulse CMDP has a logic "high" level.

Figure 22:
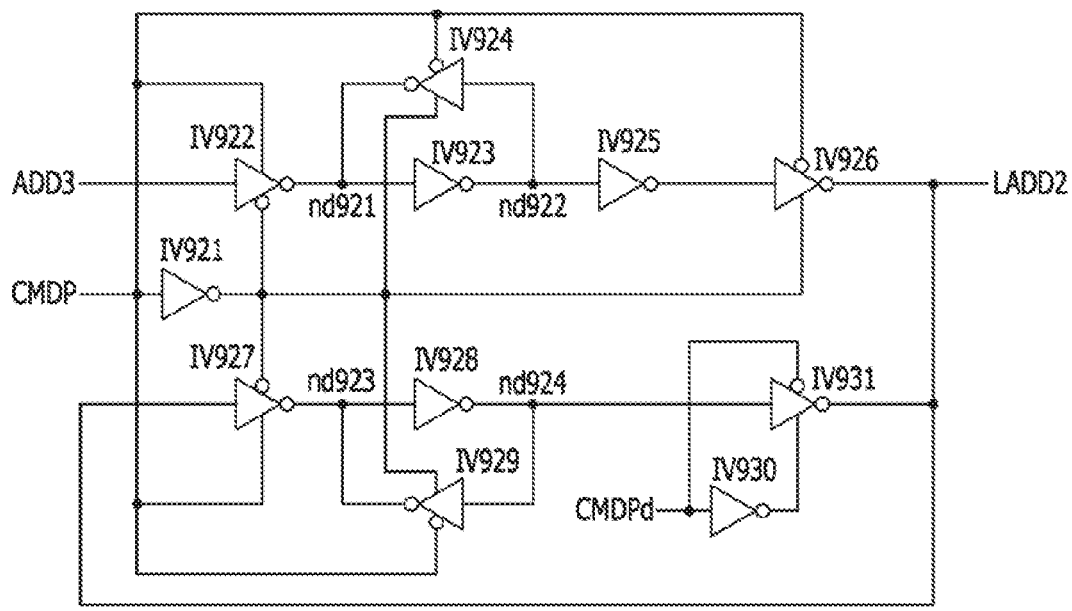
FIG. 22 is a circuit diagram illustrating an example of a second address latch signal generation circuit included in the command/address control circuit of FIG. 18.

Referring to FIG. 22, the second address latch signal generation circuit 916 may be configured to perform inversion operations. For example the second address latch signal generation circuit 916 may include inverters IV921~IV931. The inverter IV921 may inversely buffer the command pulse CMDP to output the inversely buffered signal of the command pulse CMDP. The inverter IV922 may inversely buffer the third address ADD3 to output the inversely buffered signal of the third address ADD3 to a node nd921 if the command pulse CMDP has a logic "high" level. The inverter IV923 may inversely buffer a signal of the node nd921 to output the inversely buffered signal of the signal of the node nd921 to a node nd922. The inverter IV924 may inversely buffer a signal of the node nd922 to output the inversely buffered signal of the signal of the node nd922 to the node nd921 after the command pulse CMDP is created. The inverter IV925 may inversely buffer a signal of the node nd922 to output the inversely buffered signal of the signal of the node nd922. The inverter IV926 may inversely buffer an output signal of the inverter IV925 to output the inversely buffered signal of the output signal of the inverter IV925 as the second address latch signal LADD2 after the command pulse CMDP is created. The second address latch signal generation circuit 916 may latch the third address ADD3 to output the latched address of the third address ADD3 as the second address latch signal LADD2 if the command pulse CMDP has a logic "high" level. The inverter IV927 may inversely buffer the second address latch signal LADD2 to output the inversely buffered signal of the second address latch signal LADD2 to a node nd923 if the command pulse CMDP has a logic "high" level. The inverter IV928 may inversely buffer a signal of the node nd923 to output the inversely buffered signal of the signal of the node nd923 to a node nd924. The inverter IV929 may inversely buffer a signal of the node nd924 to output the inversely buffered signal of the signal of the node nd924 to the node nd923 after the command pulse CMDP is created. The inverter IV930 may inversely buffer the delayed command pulse CMDPd to output the inversely buffered pulse of the delayed command pulse CMDPd. The inverter IV931 may inversely buffer a signal of the node nd924 to output the inversely buffered signal of the signal of the node nd924 as the second address latch signal LADD2 after the delayed command pulse CMDPd is created. The second address latch signal generation circuit 916 may latch the second address latch signal LADD2 if the command pulse CMDP has a logic "high" level and may inversely buffer the latched signal of the second address latch signal LADD2 to output the inversely buffered signal of the latched signal of the second address latch signal LADD2 as the second address latch signal LADD2 after the delayed command pulse CMDPd is created.

Figure 23:
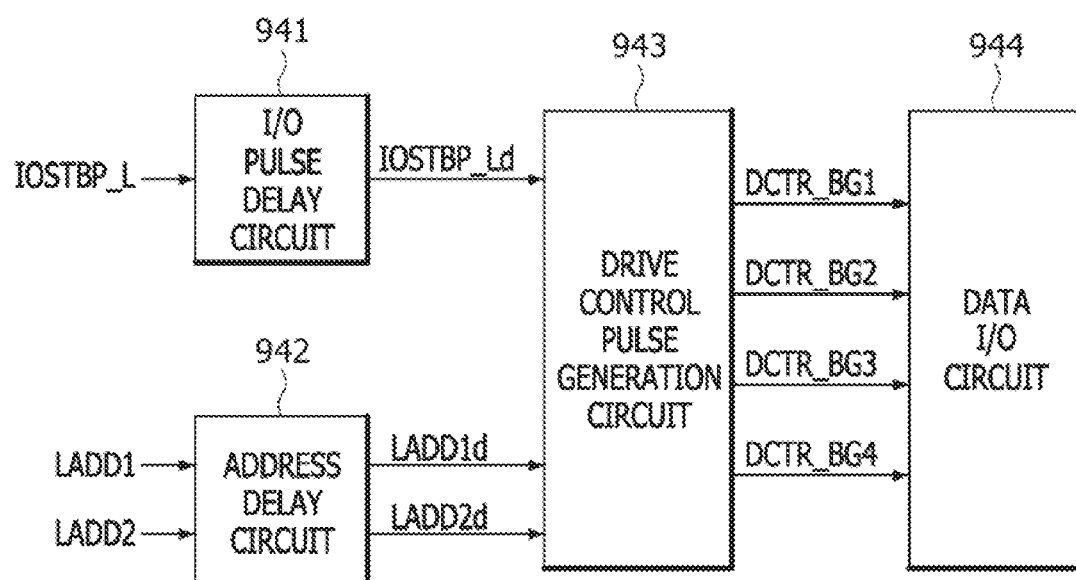
FIG. 23 is a block diagram illustrating an example of a first core circuit included in the semiconductor device of FIG. 17.

Referring to FIG. 23, the first core circuit 94 may include an I/O pulse delay circuit 941, an address delay circuit 942, a drive control pulse generation circuit 943 and a data I/O circuit 944.

The I/O pulse delay circuit 941 may delay the first I/O control pulse IOSTBP_L to generate a delayed I/O pulse IOSTBP_Ld. A configuration and an operation of the I/O pulse delay circuit 941 will be described with reference to FIG. 24 later.

The address delay circuit 942 may delay the first address latch signal LADD1 to generate a first delayed address latch signal LADD1*d*. The address delay circuit 942 may delay the second address latch signal LADD2 to generate a second delayed address latch signal LADD2*d*. A configuration and an operation of the address delay circuit 942 will be described with reference to FIG. 25. later.

The drive control pulse generation circuit 943 may generate a first drive control pulse DCTR_BG1, a second drive control pulse DCTR_BG2, a third drive control pulse DCTR_BG3 and a fourth drive control pulse DCTR_BG4 based on the delayed I/O pulse IOSTBP_Ld, the first delayed address latch signal LADD1*d* and the second delayed address latch signal LADD2*d*. The drive control pulse generation circuit 943 may control a generation sequence of the first drive control pulse DCTR_BG1, the second drive control pulse DCTR_BG2, the third drive control pulse DCTR_BG3 and the fourth drive control pulse DCTR_BG4 according to a logic level combination of the first delayed address latch signal LADD1*d* and the second delayed address latch signal LADD2*d*. A configuration and an operation of the drive control pulse generation circuit 943 will be described with reference to FIG. 26. later The data I/O circuit 944 may perform a data I/O operation based on the first drive control pulse DCTR_BG1, the second drive control pulse DCTR_BG2, the third drive control pulse DCTR_BG3 and the fourth drive control pulse DCTR_BG4. The data I/O circuit 944 may control a sequence of data I/O operations of bank groups (9441~9444 of FIG. 27) according to the generation sequence of the first to fourth drive control pulses DCTR_BG1, DCTR_BG3 and DCTR_BG4. A configuration and an operation of the data I/O circuit 944 will be described with reference to FIG. 27 later.

Figure 24:
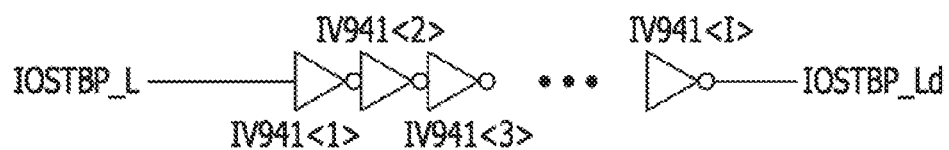
FIG. 24 is a circuit diagram illustrating an example of an I/O pulse delay circuit included in the first core circuit of FIG. 23.

Referring to FIG. 24, the I/O pulse delay circuit 941 may be realized using, for example, an inverter chain comprised of first to $I^{th}$ inverters IV941<1:I> that are cascaded. The I/O pulse delay circuit 941 may delay the first I/O control pulse IOSTBP_L using the inverter chain comprised of the first to $I^{th}$ inverters IV941<1:I> to generate the delayed I/O pulse IOSTBP_Ld.

Figure 25:
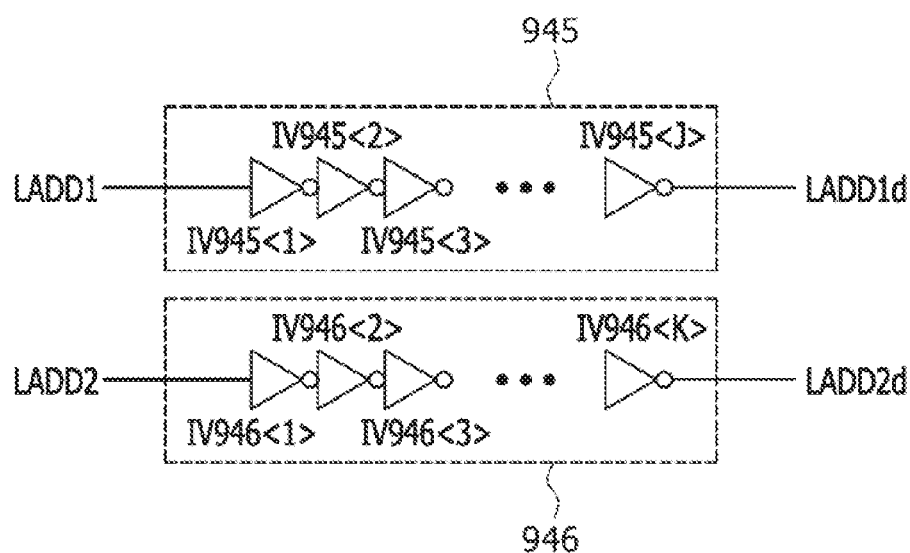
FIG. 25 is a circuit diagram illustrating an example of an address delay circuit included in the first core circuit of FIG. 23.

Referring to FIG. 25, the address delay circuit 942 may include a first address delay circuit 945 and a second address delay circuit 946. The first address delay circuit 945 may be realized using, for example, an inverter chain comprised of first to r inverters IV945<1:3> that are cascaded. The first address delay circuit 945 may delay the first address latch signal LADD1 using the inverter chain comprised of the first to $J^{th}$ inverters IV945<1:3> to output the delayed signal of the first address latch signal LADD1 as the first delayed address latch signal LADD1*d*. The second address delay circuit 946 may be realized using, for example, an inverter chain comprised of first to $K^{th}$ inverters IV946<1:K> that are cascaded. The second address delay circuit 946 may delay the second address latch signal LADD2 using the inverter chain comprised of the first to $K^{th}$ inverters IV946<1:K> to output the delayed signal of the second address latch signal LADD2 as the second delayed address latch signal LADD2*d*.

In the present embodiment, the number of the inverters included in the first to $I^{th}$ inverters IV941<1:I>, the number '3' of the inverters included in the first to $J^{th}$ inverters IV945<1:3>, and the number 'K' of the inverters included in the first to $K^{th}$ inverters IV946<1:K> may be set to be equal to each other. In some embodiments, the number 'I' of the inverters included in the first to $I^{th}$ inverters IV941<1:I>, the number '3' of the inverters included in the first to $3^{th}$ inverters IV945<1:3>, and the number 'K' of the inverters included in the first to $K^{th}$ inverters IV946<1:K> may be set to be different from each other.

Figure 26:
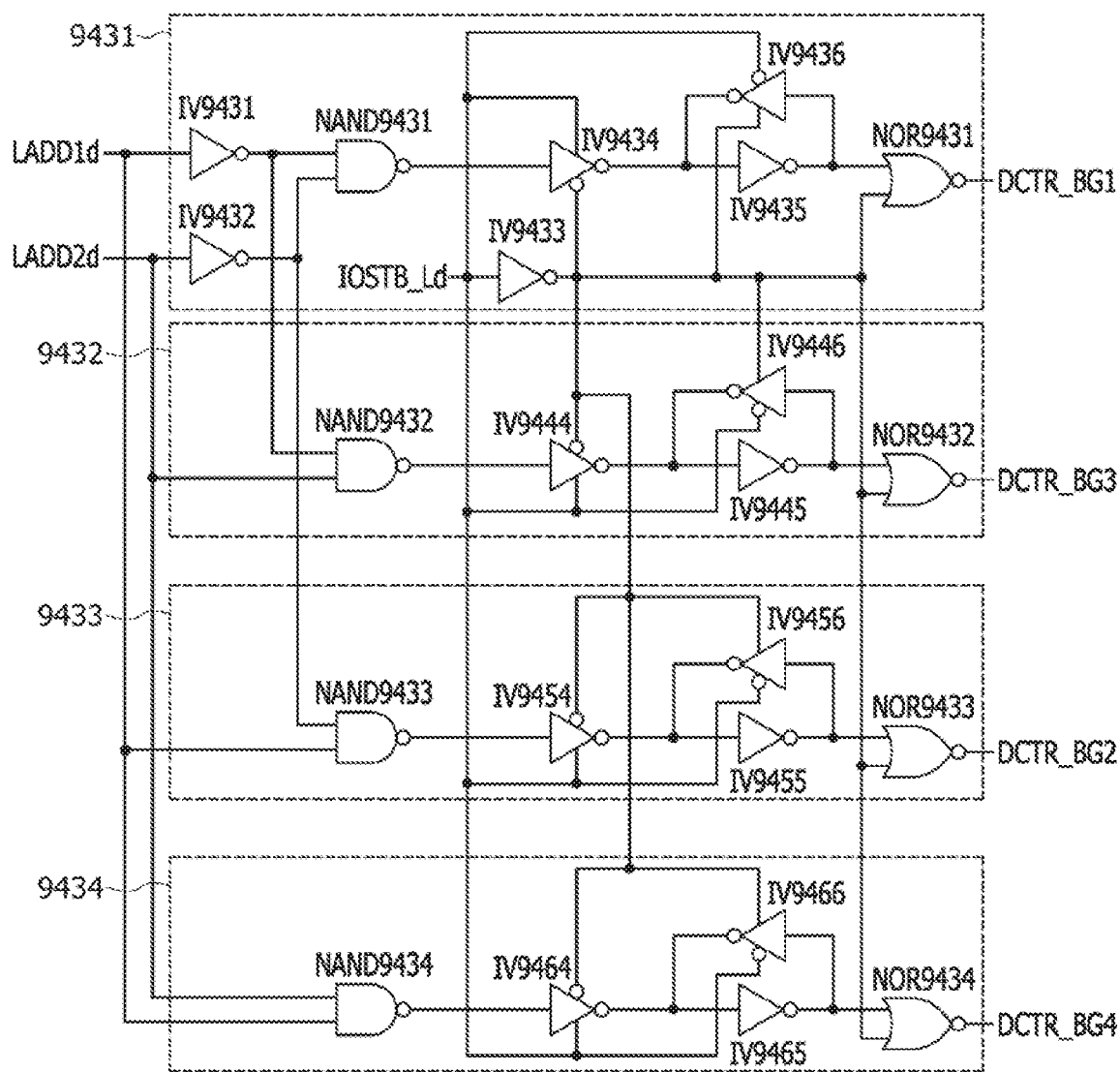
FIG. 26 is a circuit diagram illustrating an example of a drive control pulse generation circuit included in the first core circuit of FIG. 23.

Referring to FIG. 26, the drive control pulse generation circuit 943 may include a first drive control pulse generation circuit 9431, a second drive control pulse generation circuit 9432, a third drive control pulse generation circuit 9433 and a fourth drive control pulse generation circuit 9434.

The first drive control pulse generation circuit 9431 may be configured to perform inversion, NOR, and NAND operations. For example, the first drive control pulse generation circuit 9431 may include inverters IV9431~IV9436, a NAND gate NAND9431 and a NOR gate NOR9431. The inverter IV9431 may inversely buffer the first delayed address lath signal LADD1*d* to output the inversely buffered signal of the first delayed address lath signal LADD1*d*. The inverter IV9432 may inversely buffer the second delayed address lath signal LADD2*d* to output the inversely buffered signal of the second delayed address lath signal LADD2*d*. The NAND gate NAND9431 may perform a logical NAND operation of an output signal of the inverter IV9431 and an output signal of the inverter IV9432 to output the result of the logical NAND operation. The inverter IV9433 may inversely buffer the delayed I/O pulse IOSTBP_Ld to output the inversely buffered pulse of the delayed I/O pulse IOSTBP_Ld. The inverter IV9434 may inversely buffer an output signal of the NAND gate NAND9431 to output the inversely buffered signal of the output signal of the NAND gate NAND9431 if the delayed I/O pulse IOSTBP_Ld has a logic "high" level. The inverter IV9435 may inversely buffer an output signal of the inverter IV9434 to output the inversely buffered signal of the output signal of the inverter IV9434. The inverter IV9436 may inversely buffer an output signal of the inverter IV9435 to output the inversely buffered signal of the output signal of the inverter IV9435 to an input terminal of the inverter IV9435 if the delayed I/O pulse IOSTBP_Ld has a logic "low" level. The NOR gate NOR9431 may inversely buffer an output signal of the inverter IV9435 to output the inversely buffered signal of the output signal of the inverter IV9435 as the first drive control pulse DCTR_BG1 if the delayed I/O pulse IOSTBP_Ld has a logic "high" level. The first drive control pulse generation circuit 9431 may generate the first drive control pulse DCTR_BG1 having a logic "high" level if the delayed I/O pulse IOSTBP_Ld has a logic "high" level while both of the first and second delayed address lath signals LADD1*d* and LADD2*d* have a logic "low" level.

The second drive control pulse generation circuit 9432 may be configured to perform inversion, NAND, and NOR operations. For example, the second drive control pulse generation circuit 9432 may include inverters IV9444~IV9446, a NAND gate NAND9432 and a NOR gate NOR9432. The NAND gate NAND9432 may perform a logical NAND operation of the second delayed address lath signal LADD2*d* and an output signal of the inverter IV9431 to output the result of the logical NAND operation. The inverter IV9444 may inversely buffer an output signal of the NAND gate NAND9432 to output the inversely buffered signal of the output signal of the NAND gate NAND9432 if the delayed I/O pulse IOSTBP_Ld has a logic "high" level. The inverter IV9445 may inversely buffer an output signal of the inverter IV9444 to output the inversely buffered signal of the output signal of the inverter IV9444. The inverter IV9446 may inversely buffer an output signal of the inverter IV9445 to output the inversely buffered signal of the output signal of the inverter IV9445 to an input terminal of the inverter IV9445 if the delayed I/O pulse IOSTBP_Ld has a logic "low" level. The NOR gate NOR9432 may inversely buffer an output signal of the inverter IV9445 to output the inversely buffered signal of the output signal of the inverter IV9445 as the third drive control pulse DCTR_BG3 if the delayed I/O pulse IOSTBP_Ld has a logic "high" level. The second drive control pulse generation circuit 9432 may generate the third drive control pulse DCTR_BG3 having a logic "high" level if the delayed I/O pulse IOSTBP_Ld has a logic "high" level while the first delayed address lath signal LADD1*d* has a logic "low" level and the second delayed address lath signal LADD2*d* has a logic "high" level.

The third drive control pulse generation circuit 9433 may be configured to perform inversion, NAND, and NOR operations. For example, the third drive control pulse generation circuit 9433 may include inverters IV9454~IV9456, a NAND gate NAND9433 and a NOR gate NOR9433. The NAND gate NAND9433 may perform a logical NAND operation of the first delayed address lath signal LADD1*d* and an output signal of the inverter IV9432 to output the result of the logical NAND operation. The inverter IV9454 may inversely buffer an output signal of the NAND gate NAND9433 to output the inversely buffered signal of the output signal of the NAND gate NAND9433 if the delayed I/O pulse IOSTBP_Ld has a logic "high" level. The inverter IV9455 may inversely buffer an output signal of the inverter IV9454 to output the inversely buffered signal of the output signal of the inverter IV9454. The inverter IV9456 may inversely buffer an output signal of the inverter IV9455 to output the inversely buffered signal of the output signal of the inverter IV9455 to an input terminal of the inverter IV9455 if the delayed I/O pulse IOSTBP_Ld has a logic "low" level. The NOR gate NOR9433 may inversely buffer an output signal of the inverter IV9455 to output the inversely buffered signal of the output signal of the inverter IV9455 as the second drive control pulse DCTR_BG2 if the delayed I/O pulse IOSTBP_Ld has a logic "high" level. The third drive control pulse generation circuit 9433 may generate the second drive control pulse DCTR_BG2 having a logic "high" level if the delayed I/O pulse IOSTBP_Ld has a logic "high" level while the first delayed address lath signal LADD1A has a logic "high" level and the second delayed address lath signal LADD2*d* has a logic "low" level.

The fourth drive control pulse generation circuit 9434 may be configured to perform inversion, NAND, and NOR operations. For example, the fourth drive control pulse generation circuit 9434 may include inverters IV9464~IV9466, a NAND gate NAND9434 and a NOR gate NOR9434. The NAND gate NAND9434 may perform a logical NAND operation of the first delayed address lath signal LADD1*d* and the second delayed address lath signal LADD2*d* to output the result of the logical NAND operation. The inverter IV9464 may inversely buffer an output signal of the NAND gate NAND9434 to output the inversely buffered signal of the output signal of the NAND gate NAND9434 if the delayed I/O pulse IOSTBP_Ld has a logic "high" level. The inverter IV9465 may inversely buffer an output signal of the inverter IV9464 to output the inversely buffered signal of the output signal of the inverter IV9464. The inverter IV9466 may inversely buffer an output signal of the inverter IV9465 to output the inversely buffered signal of the output signal of the inverter IV9465 to an input terminal of the inverter IV9465 if the delayed I/O pulse IOSTBP_Ld has a logic "low" level. The NOR gate NOR9434 may inversely buffer an output signal of the inverter IV9465 to output the inversely buffered signal of the output signal of the inverter IV9465 as the fourth drive control pulse DCTR_BG4 if the delayed I/O pulse IOSTBP_Ld has a logic "high" level. The fourth drive control pulse generation circuit 9434 may generate the fourth drive control pulse DCTR_BG4 having a logic "high" level if the delayed I/O pulse IOSTBP_Ld has a logic "high" level while both of the first and second delayed address lath signals LADD1*d* and LADD2*d* has a logic "high" level.

Figure 27:
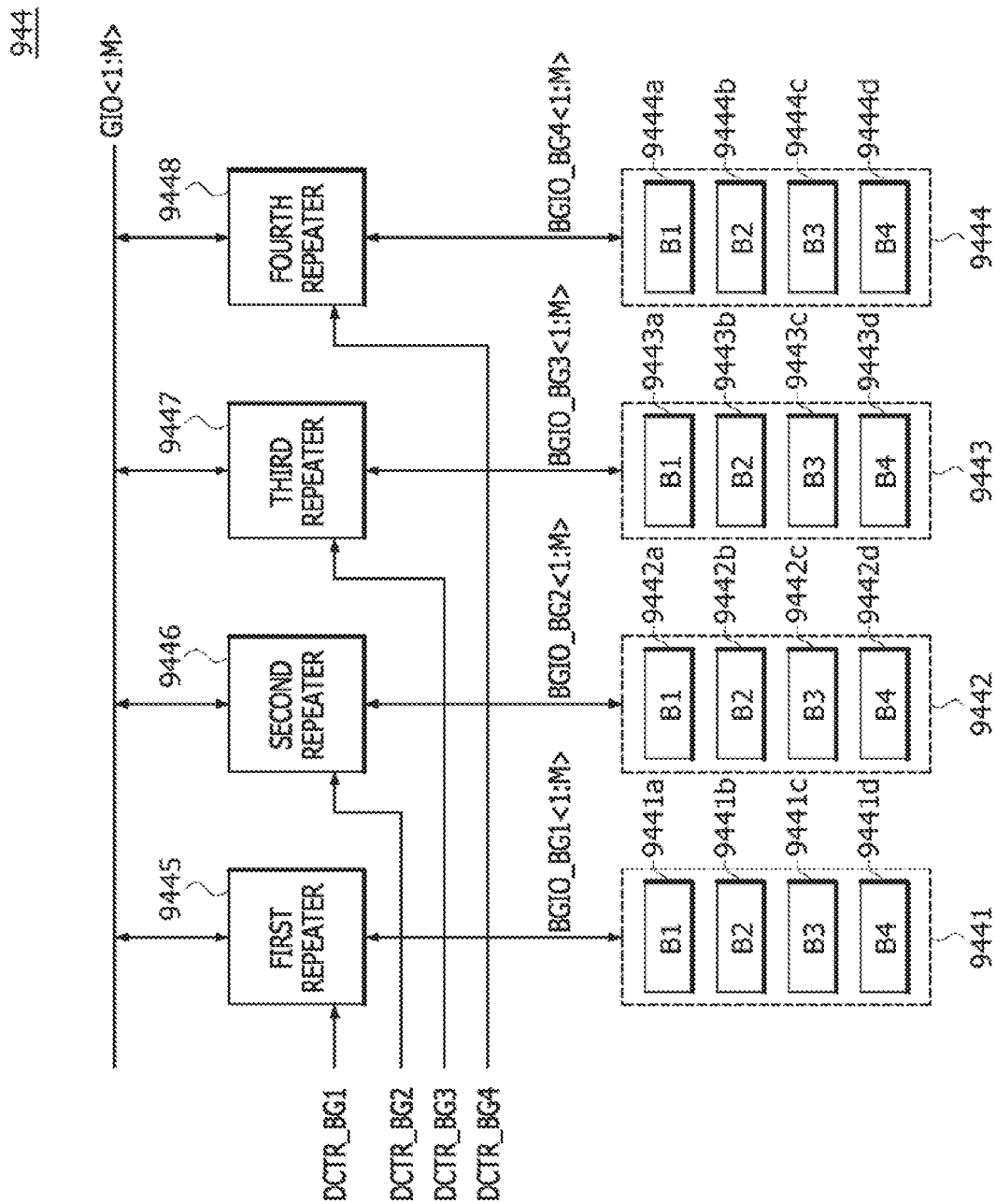
FIG. 27 is a block diagram illustrating an example of a data I/O circuit included in the first core circuit of FIG. 23.

Referring to FIG. 27, the data I/O circuit 944 may include a first bank group 9441, a second bank group 9442, a third bank group 9443, a fourth bank group 9444, a first repeater 9445, a second repeater 9446, a third repeater 9447 and a fourth repeater 9448. The first bank group 9441 may include first to fourth banks 9441*a*~9441*d*. The second bank group 9442 may include first to fourth banks 9442*a*~9442*d*. The third bank group 9443 may include first to fourth banks 9443*a*~9443*d*. The fourth bank group 9444 may include first to fourth banks 9444*a*~9444*d*. The first repeater 9445 may receive the first drive control pulse DCTR_BG1 generated during a read operation to amplify first I/O data BGIO_BG1<1:M> outputted from the first to fourth banks 9441a~9441d included in the first bank group 9441 and to output the amplified data of the first I/O data BGIO_BG1<1: 1\1> through an I/O line GIO<1:M>. The first repeater 9445 may amplify data inputted through the I/O line GIO<1:M> based on the first drive control pulse DCTR_BG1 generated during a write operation to generate the first I/O data BGIO_BG1<1:M> to be stored into the first to fourth banks 9441a~9441d included in the first bank group 9441. The second repeater 9446 may receive the second drive control pulse DCTR_BG2 generated during the read operation to amplify second I/O data BGIO_BG2<1:M> outputted from the first to fourth banks 9442a~9442d included in the second bank group 9442 and to output the amplified data of the second I/O data BGIO_BG2<1: through the I/O line GIO<1: M>. The second repeater 9446 may amplify data inputted through the I/O line GIO<1:M> based on the second drive control pulse DCTR_BG2 generated during the write operation to generate the second I/O data BGIO_BG2<1:M> to be stored into the first to fourth banks 9442a~9442d included in the second bank group 9442. The third repeater 9447 may receive the third drive control pulse DCTR_BG3 generated during the read operation to amplify third I/O data BGIO_BG3<1:M> outputted from the first to fourth banks 9443a~9443d included in the third bank group 9443 and to output the amplified data of the third I/O data BGIO_BG3<1:M> through the I/O line GIO<1:M>. The third repeater 9447 may amplify data inputted through the I/O line GIO<1:M> based on the third drive control pulse DCTR_BG3 generated during the write operation to generate the third I/O data BGIO_BG3<1:M> to be stored into the first to fourth banks 9443a~9443d included in the third bank group 9443. The fourth repeater 9448 may receive the fourth drive control pulse DCTR_BG4 generated during the read operation to amplify fourth I/O data BGIO_BG4<1:M> outputted from the first to fourth banks 9444a~9444d included in the fourth bank group 9444 and to output the amplified data of the fourth I/O data BGIO_BG4<1:M> through the I/O line GIO<1:M>. The fourth repeater 9448 may amplify data inputted through the I/O line GIO<1:M> based on the fourth drive control pulse DCTR_BG4 generated during the write operation to generate the fourth I/O data BGIO_BG4<1:M> to be stored into the first to fourth banks 9444a~9444d included in the fourth bank group 9444.

An operation of the semiconductor device having the aforementioned configuration will be described hereinafter with reference to FIGS. 28 and 29. It may be assumed that points of time "T13" illustrated in FIGS. 28 and 29 denote the same point of time and points of time "T14" illustrated in FIGS. 28 and 29 denote the same point of time. Moreover, it may be assumed that points of time "T15" illustrated in FIGS. 28 and 29 denote the same point of time and points of time "T16" illustrated in FIGS. 28 and 29 denote the same point of time.

Figure 28:
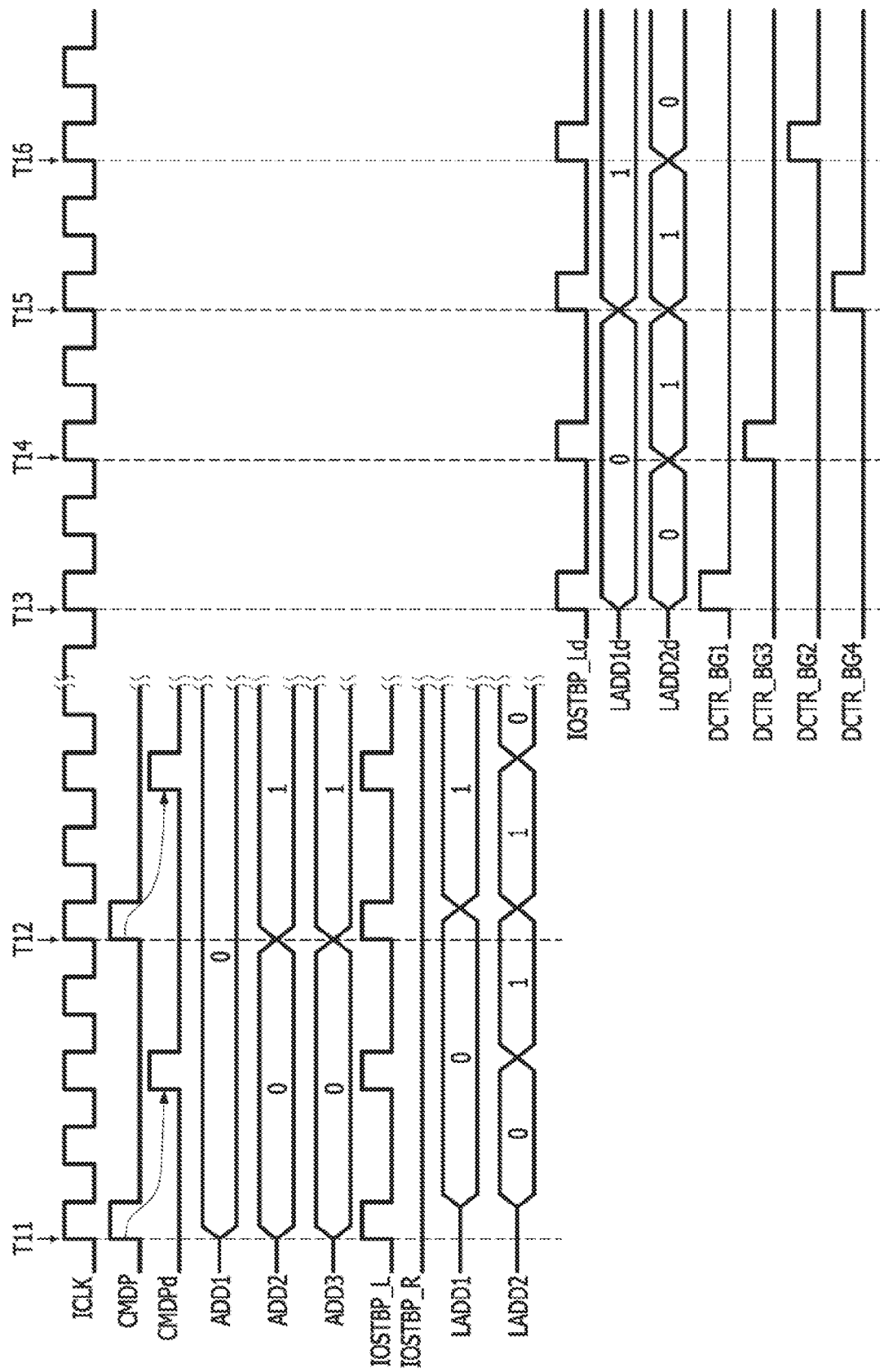
FIGS. 28 and 29 are timing diagrams illustrating an operation of the semiconductor device shown in FIGS. 17 to 27.

As illustrated in FIG. 28, all of the first to third address signals ADD1, ADD2 and ADD3 may be set to have a logic "low" level when the command pulse CMDP for the read operation is created at a point of time "T11", and the first address ADD1 may be set to maintain a logic "low" level and both of the second and third addresses ADD2 and ADD3 may be set to have a logic "high" level when the command pulse CMDP for the read operation is created at a point of time "T12". In FIG. 28, '0' means a logic "low" level and '1' means a logic "high" level. The delayed command pulse CMDPd may be generated at a point of time that a period corresponding to two cycles of the internal clock signal ICLK elapses from a point of time that the command puke CMDP is created. Since the first address ADD1 is set to have a logic "low" level from the point of time "T11", the first I/O control pulse IOSTBP_L may be generated whenever the command pulse CMDP or the delayed command pulse CMDPd is created. Since the second address ADD2 is set to have a logic "low" level during a period from the point of time "T11" till the point of time "T12", the first address latch signal LADD1 may be set to have a logic "low" level by the second address ADD2 latched when the command pulse CMDP is created. Since the second address ADD2 is set to have a logic "high" from the point of time "T12", the first address latch signal LADD1 may be set to have a logic "high" level by the second address ADD2 latched when the command pulse CMDP is created. Since the third address ADD3 is set to have a logic "low" level during a period from the point of time "T11" till the point of time "T12", the second address latch signal LADD2 may be set to have a logic "low" level from a point of time that the command pulse CMDP is created and the second address latch signal LADD2 may be set to have a logic "high" level from a point of time that the delayed command pulse CMDPd is created. Since the third address ADD3 is set to have a logic "high" level from the point of time "T12", the second address latch signal LADD2 may be set to have a logic "high" level from a point of time that the command pulse CMDP is created and the second address latch signal LADD2 may be set to have a logic "low" level from a point of time that the delayed command puke CMDPd is created.

As illustrated in FIG. 28, the first I/O control pulse IOSTBP_L may be delayed to provide the delayed I/O pulse IOSTBP_Ld, the first address latch signal LADD1 may be delayed to provide the first delayed address latch signal LADD1d, and the second address latch signal LADD2 may be delayed to provide the second delayed address latch signal LADD2d. Since both of the first and second delayed address latch signals LADD1d and LADD2d have a logic "low" level during a period from the point of time "T13" till the point of time "T14", the first drive control pulse DCTR_BG1 may be generated when the delayed I/O pulse IOSTBP_Ld is created. Since the first delayed address latch signal LADD1d has a logic "low" level and the second delayed address latch signal LADD2d has a logic "high" level during a period from the point of time "T14" till the point of time "T15", the third drive control pulse DCTR_BG3 may be generated when the delayed I/O pulse IOSTBP_Ld is created. Since both of the first and second delayed address latch signals LADD1d and LADD2d have a logic "high" level during a period from the point of time "T15" till the point of time "T16", the fourth drive control pulse DCTR_BG4 may be generated when the delayed I/O pulse IOSTBP_Ld is created. Since the first delayed address latch signal LADD1d has a logic "high" level and the second delayed address latch signal LADD2d has a logic "low" level from the point of time "T16", the second drive control pulse DCTR_BG2 may be generated when the delayed I/O pulse IOSTBP_Ld is created.

Figure 29:
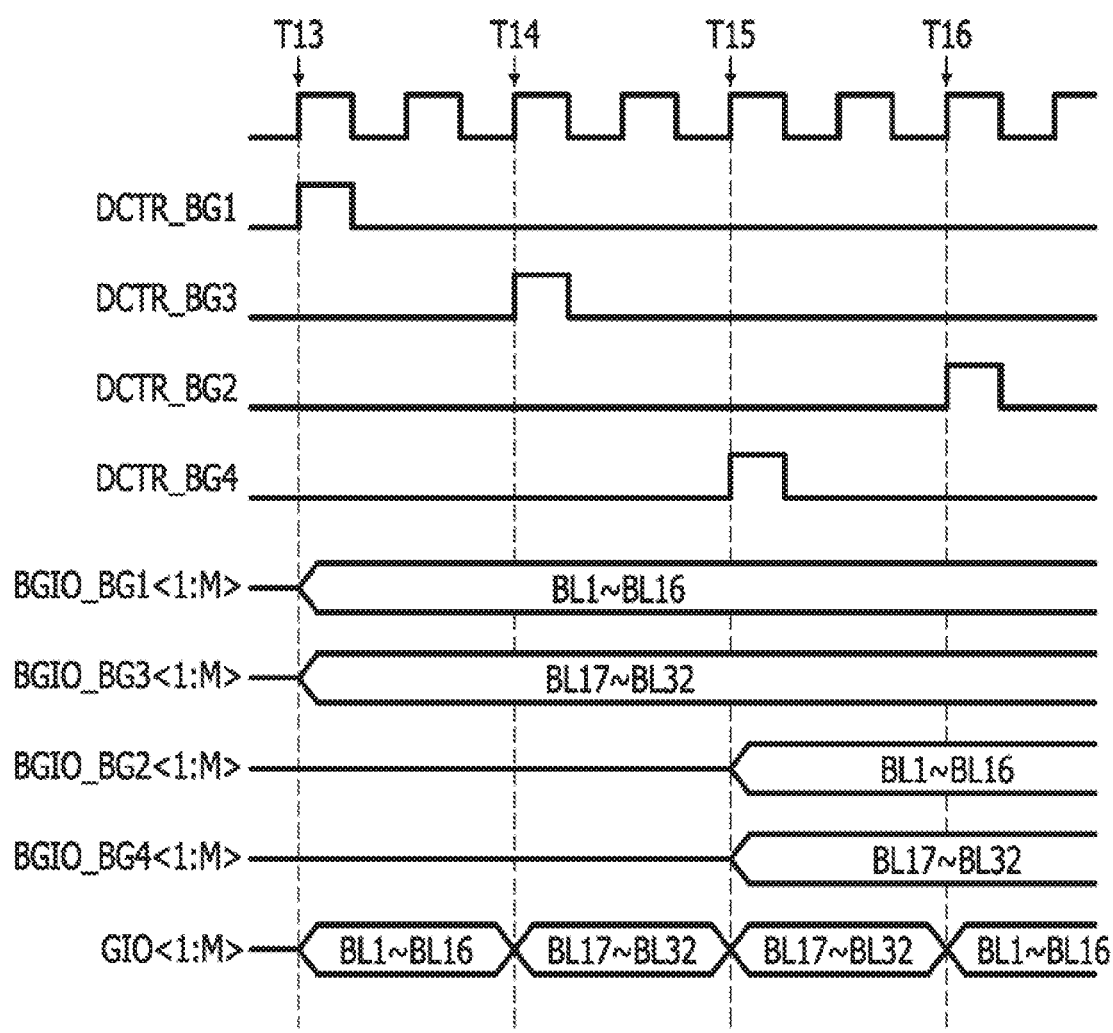

As illustrated in FIG. 29, the first I/O data BGIO_BG1<1: M> outputted from the first bank group 9441 may be amplified by the first drive control pulse DCTR_BG1 generated at the point of time "T13", and the amplified data of the first I/O data BGIO_BG1<1:M> may be outputted through the I/O line GIO<1:M>, The third I/O data BGIO_BG3<1:M> outputted from the third bank group 9443 may be amplified by the third drive control pulse DCTR_BG3 generated at the point of time "T14", and the amplified data of the third I/O data BGIO_BG3<1:M> may be outputted through the I/O line GIO<1:M>. While a burst length is set to be '32', the first I/O data BGIO_BG1<1:M> having sixteen bits (e.g., BL1~BL16) may be outputted at the point of time "T13" through the I/O line GIO<1:M> and the third I/O data BGIO_BG3<1:M> having sixteen bits (e.g., BL17~BL32) may then be outputted at the point of time "T14" through the I/O line GIO<1:M>. The fourth I/O data BGIO_BG4<1:M> outputted from the fourth bank group 9444 may be amplified by the fourth drive control pulse DCTR_BG4 generated at the point of time "T15", and the amplified data of the fourth I/O data BGIO_BG4<1:M> may be outputted through the I/O line GIO<1:M>. The second I/O data BGIO_BG2<1:M> outputted from the second bank group 9442 may be amplified by the second drive control pulse DCTR_BG2 generated at the point of time "T16", and the amplified data of the second I/O data BGIO_BG2<1:M> may be outputted through the I/O line GIO<1:M>. While the burst length is set to be '32', the fourth I/O data BGIO_BG4<1:M> having sixteen bits (e.g., BL17~BL32) may be outputted at the point of time "T15" through the I/O line GIO<1:M> and the second I/O data BGIO_BG2<1:M> having sixteen bits (e.g., BL1~BL16) may then be outputted at the point of time "T16" through the I/O line GIO<1:M>.

Although FIGS. 28 and 29 illustrates the read operation of the semiconductor device described with reference to FIGS. 17 to 27 while the burst length is set to be '32', the present disclosure is not limited thereto. For example, in some other embodiments, the present disclosure may also be applied to the write operation of the semiconductor device while the burst length is set to be equal to or different from '32'.

As described above, a semiconductor device according to an embodiment may sequentially perform read operations or write operations for a plurality of bank groups whenever the command pulse CMDP is created. Thus, operation time and power consumption of the semiconductor device may be reduced by sequentially executing data I/O operations of the plurality of bank groups with a circuit for executing the data I/O operation of one bank group, as compared with a case that data I/O operations for a plurality of bits are simultaneously executed. In addition, the semiconductor device may select a core circuit and may control a sequence of data I/O operations for the plurality of bank groups according to a logic level combination of the first to third addresses ADD1, ADD2 and ADD3 extracted from the external control signal CA<1:L>. For example, as illustrated in FIGS. 28 and 29, the semiconductor device may control a sequence of the data I/O operations for the first to fourth bank groups 9441, 9442, 9443 and 9444 such that the first I/O data BGIO_BG1<1:M> stored in the first bank group 9441, the third I/O data BGIO_BG3<1:M> stored in the third bank group 9443, the fourth I/O data BGIO_BG4<1:M> stored in the fourth bank group 9444, and the second I/O data BGIO_BG2<1:M> stored in the second bank group 9442 may be sequentially outputted. Alternatively, a sequence of the data I/O operations for the bank groups may be controlled by an external signal or an internal signal instead of the addresses.

Figure 30:
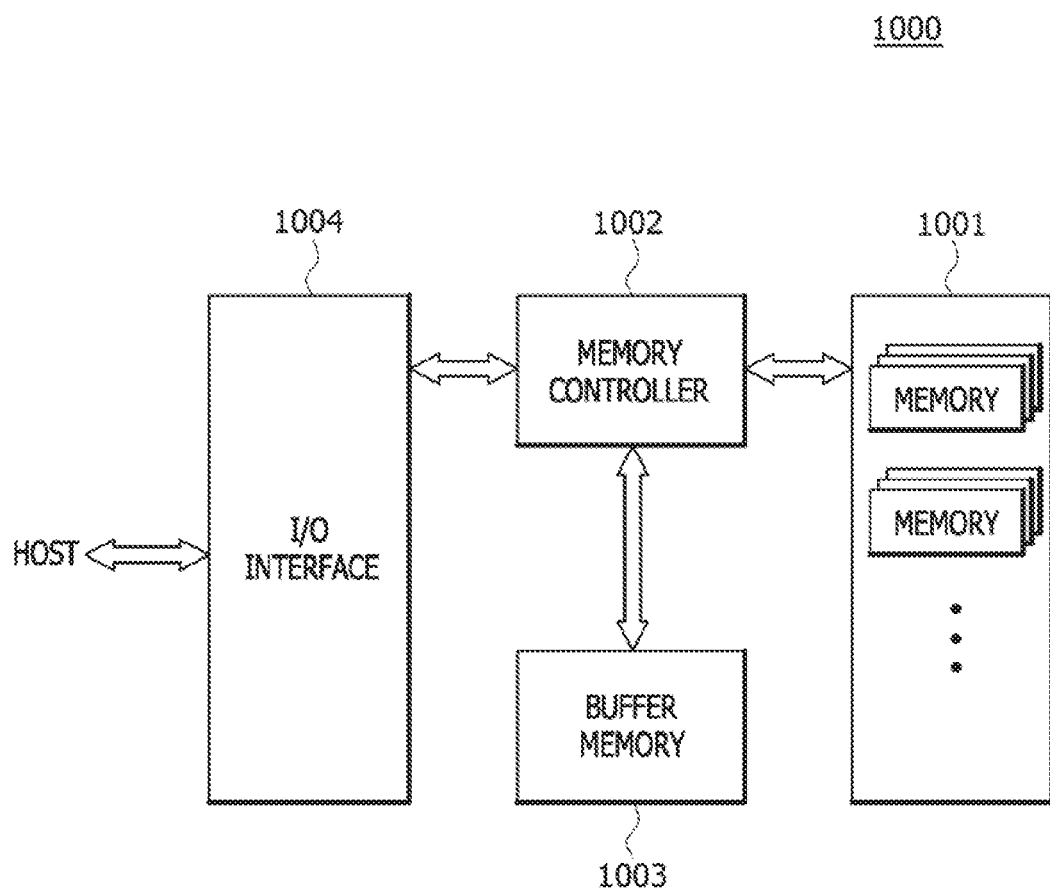
FIG. 30 is a block diagram illustrating a configuration of an electronic system employing the semiconductor device shown in FIGS. 1 to 17.

The semiconductor devices described with reference to FIGS. 1 to 29 may be applied to an electronic system that includes a memory system, a graphic system, a computing system, a mobile system, or the like. For example, as illustrated in FIG. 30, an electronic system 1000 according to an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal outputted from the memory controller 1002. The data storage circuit 1001 may include at least one the semiconductor devices illustrated in FIGS. 1 and 17. Meanwhile, the data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the is data stored in the data storage circuit 1001 or the buffer memory 1003. Although FIG. 30 illustrates the memory controller 1002 with a single block, the memory controller 1002 may include one controller for controlling the data storage circuit 1001 and another controller for controlling the buffer memory 1003 comprised of a volatile memory.

The buffer memory 1003 may temporarily store the data to be processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control to signals and data supplied from the external device (i.e., the host) through the I/O interface 1004 and may output the data outputted from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
an input and output (I/O) line drive control circuit configured to generate first to fourth drive control pulses for controlling data I/O operations of first to fourth bank groups according to a logic level combination of first and second address latch signals,
wherein the I/O line drive control circuit generates the third drive control pulse after the first drive control pulse is generated when both of the first and second address latch signals have a first logic level.

2. The semiconductor device of claim 1, wherein the I/O line drive control circuit generates the first drive control pulse after the third drive control pulse is generated when the first address latch signal has a first logic level and the second address latch signal has a second logic level.

3. The semiconductor device of claim 1, wherein the I/O line drive control circuit generates the fourth drive control pulse after the second drive control pulse is generated when the first address latch signal has a second logic level and the second address latch signal has a first logic level.

4. The semiconductor device of claim 1, wherein the I/O line drive control circuit generates the second drive control pulse after the fourth drive control pulse is generated when both of the first and second address latch signals have a second logic level.

* * * * *